(12) United States Patent
Ready et al.

(10) Patent No.: US 7,549,719 B2
(45) Date of Patent: *Jun. 23, 2009

(54) METHOD FOR THE PRINTING OF HOMOGENEOUS ELECTRONIC MATERIAL WITH A MULTI-EJECTOR PRINT HEAD

(75) Inventors: Steven E. Ready, Santa Cruz, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 463 days.

This patent is subject to a terminal disclaimer.

(21) Appl. No.: 11/019,038

(22) Filed: Dec. 20, 2004

(65) Prior Publication Data

US 2005/0142293 A1    Jun. 30, 2005

Related U.S. Application Data

(63) Continuation of application No. 10/224,701, filed on Aug. 20, 2002, now Pat. No. 6,890,050.

(51) Int. Cl.
*B41J 29/393* (2006.01)
(52) U.S. Cl. .................................. 347/19; 347/2; 347/5
(58) Field of Classification Search .................... 347/19, 347/2, 40–41
See application file for complete search history.

(56) References Cited

U.S. PATENT DOCUMENTS

| | | | |
|---|---|---|---|
| 5,689,428 A | 11/1997 | Sauerbrey et al. | |
| 5,924,804 A | 7/1999 | Hino et al. | |
| 5,984,470 A * | 11/1999 | Sakino et al. | 347/106 |
| 6,158,344 A | 12/2000 | Walker et al. | |
| 6,328,418 B1 | 12/2001 | Yamada et al. | |
| 6,386,671 B1 | 5/2002 | Huston et al. | |
| 6,460,958 B2 | 10/2002 | Kubo et al. | |
| 6,786,563 B1 * | 9/2004 | Jones | 347/2 |
| 6,890,050 B2 * | 5/2005 | Ready et al. | 347/19 |
| 2001/0019340 A1 | 9/2001 | Kubo et al. | |
| 2002/0054197 A1 | 5/2002 | Okada et al. | |

FOREIGN PATENT DOCUMENTS

| | | |
|---|---|---|
| DE | 199 18 193 A1 | 11/1999 |
| DE | 198 42 379 A1 | 5/2000 |
| EP | 0 636 485 A1 | 2/1995 |
| EP | 0 938 976 A1 | 9/1999 |
| JP | 2 226792 A | 9/1990 |
| JP | 2001-232826 A | 8/2001 |
| WO | WO 02/03322 A1 | 1/2002 |

* cited by examiner

*Primary Examiner*—Lam S Nguyen
(74) *Attorney, Agent, or Firm*—Bever, Hoffman & Harms, LLP; Patrick T. Bever

(57) ABSTRACT

Printing systems are disclosed that produce homogenous, smooth edged printed patterns (such as integrated circuit (IC) patterns) by separating pattern layouts into discrete design layers having only parallel layout features. By printing each design layer in a printing direction aligned with the parallel layout features, the individual print solution droplets deposited onto the substrate do not dry before adjacent droplets are deposited. Therefore, printed patterns having accurate geometries and consistent electrical properties can be printed.

4 Claims, 19 Drawing Sheets

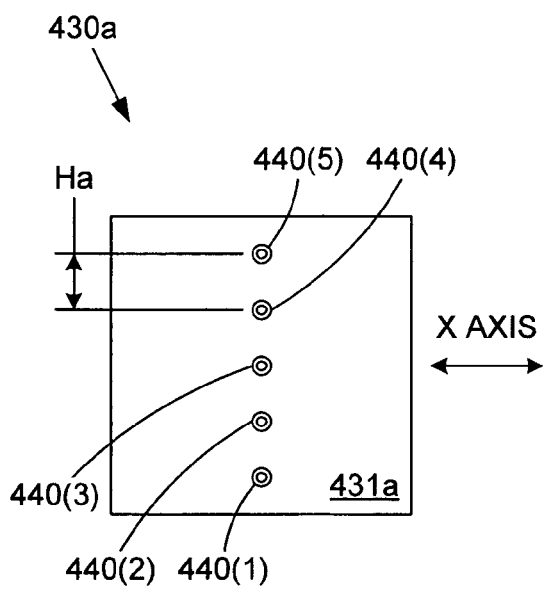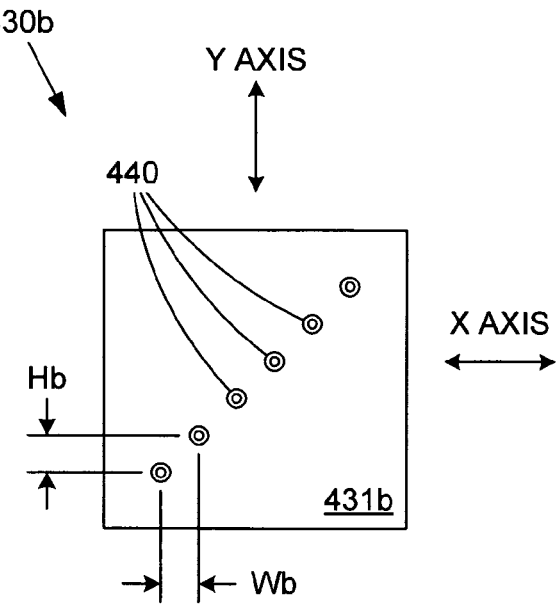
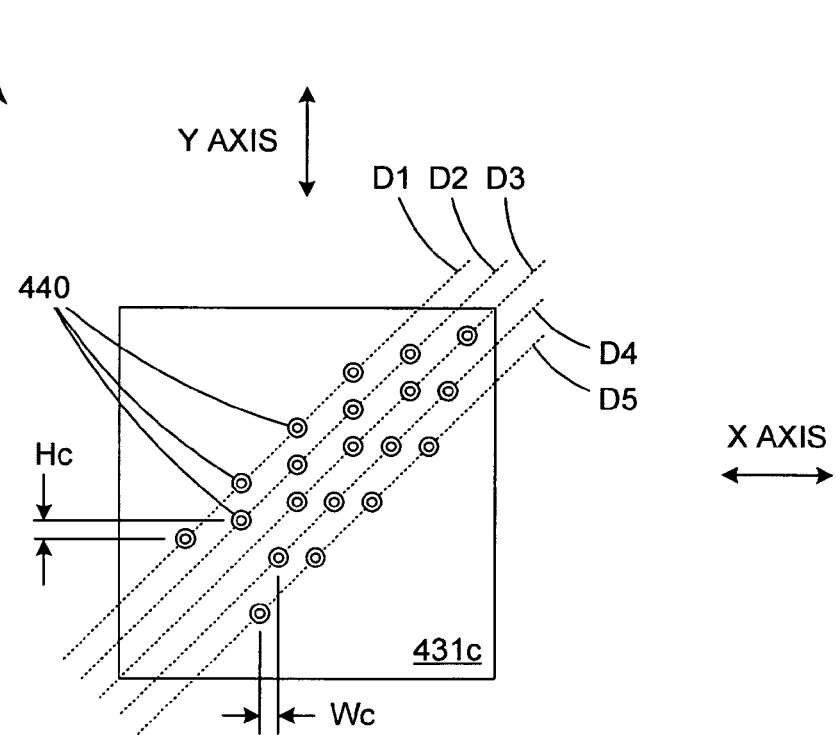
Fig. 4a
Fig. 4b
Fig. 4c

METHOD FOR THE PRINTING OF HOMOGENEOUS ELECTRONIC MATERIAL WITH A MULTI-EJECTOR PRINT HEAD

RELATED APPLICATIONS

Further, this application is a continuation of U.S. patent application Ser. No. 10/224,701, entitled "Method For The Printing Of Homogeneous Electronic Material With A Multi-Ejector Print Head", filed Aug. 20, 2002, now U.S. Pat. No. 6,890,050.

This invention was made with Government support under 70NANBOH3033 awarded by NIST/ATP. The Government has certain rights in this invention.

FIELD OF THE INVENTION

This invention relates generally to electronic materials processing, and more particularly to a method and system for creating and operating a high-resolution printing system.

BACKGROUND OF THE INVENTION

Integrated circuit (IC) printing is an emerging technology that attempts to reduce the costs associated with IC production by replacing expensive lithographic processes with simple printing operations. By printing an IC pattern directly on a substrate rather than using the delicate and time-consuming lithography processes used in conventional IC manufacturing, an IC printing system can significantly reduce IC production costs. The printed IC pattern can either comprise actual IC features (i.e., elements that will be incorporated into the final IC, such as the gates and source and drain regions of thin film transistors, signal lines, opto-electronic device components, etc.) or it can be a mask for subsequent semiconductor processing (e.g., etch, implant, etc.).

Typically, IC printing involves depositing a print solution (generally an organic material) by raster bitmap along a single axis (the "print travel axis") across a solid substrate. Print heads, and in particular, the arrangements of the ejectors incorporated in those print heads, are optimized for printing along this print travel axis. Printing of an IC pattern takes place in a raster fashion, with the print head making "printing passes" across the substrate as the ejector(s) in the print head dispense individual droplets of print solution onto the substrate. At the end of each printing pass, the print head makes a perpendicular shift relative to the print travel axis before beginning a new printing pass. The print head continues making printing passes across the substrate in this manner until the IC pattern has been fully printed.

Once dispensed from the ejector(s) of the print head, print solution droplets attach themselves to the substrate through a wetting action and proceed to solidify in place. The size and profile of the deposited material is guided by competing processes of solidification and wetting. In the case of printing phase-change materials for etch mask production, solidification occurs when the printed drop loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the print solution and substrate, along with the ambient atmospheric conditions, determine the specific rate at which the deposited print solution transforms from a liquid to a solid.

If a first droplet and a second adjacent droplet are applied onto the substrate within a time prior to the phase transformation of the first droplet, the second droplet will wet and coalesce to the first droplet in its liquid or semi-liquid state to form a continuous printed feature. Print solutions having high surface tension will also beneficially prevent the next overlapping droplet from spreading on the substrate surface, thus minimizing the lateral spreading of the droplets. FIG. 1a shows a photograph of a printed feature 100a that was printed in a single printing pass in the X axis direction. Because adjacent droplets deposited during the single printing pass did not have time to dry between ejection events, feature 100a exhibits the desired homogeneity and smooth side wall profiles that result from optimal droplet coalescence. In contrast, FIG. 1b shows a photograph of a printed feature 100b formed by raster printing in the Y axis direction. Feature 100b therefore represents a "multi-pass" feature; i.e., a printed feature formed by multiple passes of the print head. In a multi-pass feature, the droplets deposited during sequential passes of the print head are typically dry before any adjacent droplets from the next printing pass are deposited. Consequently, the drops of print solution that make up the multi-pass feature are not able to coalesce and therefore create "scalloped" feature borders. This edge scalloping can be seen in FIG. 1b, as the individual print solution droplets 110b used to form feature 100b are all clearly visible.

Typically, an IC pattern includes both multi-pass features and features that are aligned with the print direction. FIG. 1c shows a photograph of an IC pattern 100c printed using a conventional IC printing process—in this case a raster printing operation in the Y axis direction. IC pattern 100c is made up of an array of transistor elements 120 interconnected by multiple address lines 160 and word lines 170. Word lines 170, which run parallel to the Y axis and were therefore aligned with the print direction, exhibit the desirable homogeneity and smooth sidewalls described with respect to FIG. 1a. However, address lines 160, which are printed by multiple printing passes in the Y axis direction, all exhibit the undesirable edge scalloping and non-coalescence described with respect to FIG. 1b.

The edge scalloping shown in FIGS. 1b and 1c is related to a variety of problematic issues. For example, if the IC pattern is a mask, the irregular edges of feature 100b can result in unreliable print quality and patterning defects leading to inconsistent device performance. Perhaps more significantly, edge scalloping in an actual IC feature indicates a potentially serious underlying defect. The electronic behavior of an IC feature is affected by its molecular structure. In particular, the molecules of organic printing fluids are typically long chains that need to self-assemble in a particular order. However, if a droplet of such printing solution solidifies before an adjacent droplet is deposited, those chains are not allowed to properly assemble, leading to a significant reduction in the electrical continuity between the two droplets. This in turn can severely diminish the performance of the device that incorporates the scalloped printed feature.

What is needed is a system and method for accurately printing IC patterns that allows the printed features to be optimized for edge profile and electrical continuity.

SUMMARY OF THE INVENTION

The present invention is directed towards printing systems that can be used to produce homogenous printed patterns on a substrate. By separating a pattern layout into discrete design layers having only parallel layout features, a printed pattern can be formed by a series of printing operations, wherein the print direction of each printing operation is aligned with the parallel layout features of the design layer being printed. In this manner, the printing of multi-pass features can be avoided, and homogenous, smooth-edged printed patterns can be printed.

According to an embodiment of the invention, the print head in a printing system can have ejectors spaced according to the design rules of the pattern being printed, thereby enhancing printing throughput by minimizing the amount of perpendicular shifting required between printing passes. According to another embodiment of the invention, the design rules of a pattern layout can be formulated according to the known ejector spacing in a print head to be used in printing the IC layout.

According to another embodiment of the invention, a print head can be designed to print in multiple directions by arranging the ejectors in a pattern conducive to multi-directional printing (i.e., arranging the ejectors in a pattern other than a straight line perpendicular to the print direction). Various ejector arrangements can be incorporated into a print head to enhance the printing capability of a printing system.

A printing system can be calibrated to provide optimal accuracy by comparing the actual location of printed spots with their design (expected) locations and adjusting the printing system accordingly. For example, according to an embodiment of the invention, rotational misalignment of the print head to the stage can be detected and corrected by printing test spots from two different ejectors at the same design location, and then rotating the print head to compensate for any offset between the actual printed spots. According to another embodiment of the invention, test spots from all the ejectors could be dispensed at once and compared against their expected locations. A graph of the linear offsets can then be used to calculate an angular offset for the print head.

According to another embodiment of the invention, test spots from all the ejectors in a print head can be used to compensate for thermally induced changes in ejector position. By graphing the horizontal and vertical offsets from expected ejector positions, a thermal correction factor can be derived for calculating the actual ejector positions from the design ejector positions.

According to another embodiment of the invention, printing operations involving different design layers can be aligned by initially printing alignment marks on the substrate. By calibrating the IC printing system against those alignment marks prior to printing new design layers, alignment between the IC features printed from the different design layers can be maintained.

According to another embodiment of the invention, the ejectors in a print head can be selection-filtered so that those ejectors that cannot provide a minimum level of printing accuracy are not used. According to an embodiment of the invention, a rasterized image can be efficiently printed with the print head in this "sparse" ejector condition by aligning the first active ejector with the first raster column of the rasterized image. This in turn aligns any other active ejectors with other raster columns, and the data from the raster columns aligned with active ejectors are printed. The first active ejector is then shifted to the next raster column that contains valid data, thereby aligning the other active ejectors with new raster columns. The new data is then printed, and the process is continued until no valid data remains in the rasterized image.

BRIEF DESCRIPTION OF THE DRAWINGS

These and other features, aspects and advantages of the present invention will become better understood with regard to the following description, appended claims, and accompanying drawings, where:

FIGS. 4a, 4b, and 4c are facing views of print heads in accordance with other embodiments of the invention;

DETAILED DESCRIPTION OF THE DRAWINGS

Figure 2:
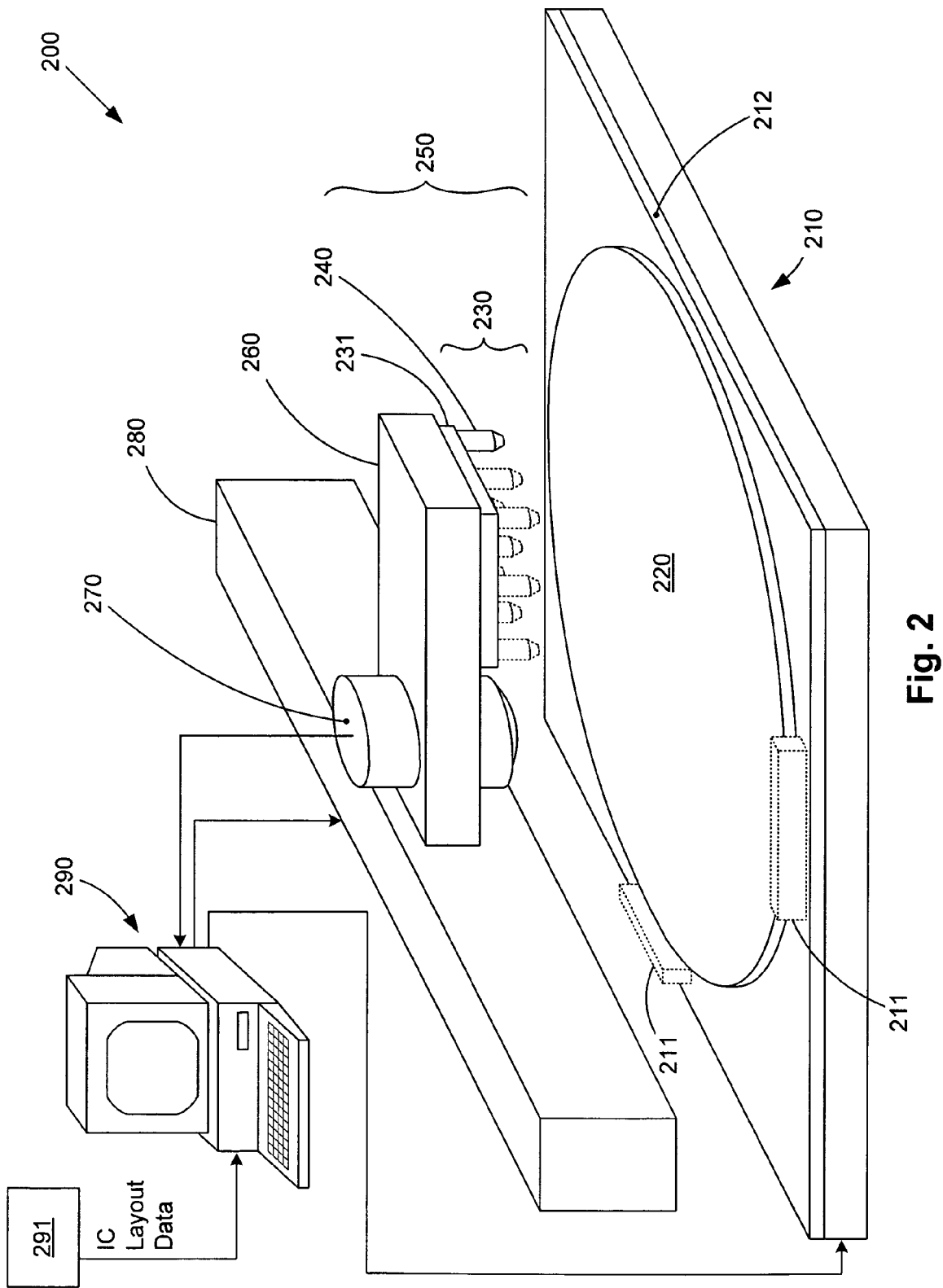
FIG. 2 is a perspective view showing a printing system according to an embodiment of the invention.

FIG. 2 is a perspective view of a printing system 200 in accordance with an embodiment of the invention. Note that while the embodiments of the invention are described with respect to IC printing for explanatory purposes, the invention can be applied to any situation in which homogenous, smooth-walled features in a printed pattern are required. Printing system 200 includes a stage 210 for supporting (and optionally translating) a substrate 220, a print assembly 250 mounted to a printing support structure 280, and a computer/workstation 290 that serves as both a system controller and data processor. Stage 210 includes a rotational platform 212 that allows the orientation of substrate 220 to be adjusted. Optional alignment features 211 on rotational platform 212 can be included to provide gross positioning and capture of substrate 220. Print assembly 250 includes a print head 230 (on a rotational fixture) and a camera 270 (having high magnification capabilities) mounted in a rigid mount 260. Print head 230 includes one or more ejectors 240 mounted in an ejector base 231. Ejectors 240 are configured to dispense droplets of a printing fluid on substrate 220. Depending on the type and intended use of the printed pattern being formed, the printing fluid can comprise a variety of materials, including phase-change materials such as wax or photoresist (to form semiconductor process masks), and colloidal suspensions such as solution-processable electronic (i.e., conducting, semiconducting, or dielectric) materials, and organic or inorganic materials (e.g., to form IC features). Substrate 220 can comprise any material on which patterning can be performed, such as a wafer, a glass plate, or even flexible materials such as fabric or plastics. As will be discussed subsequently, ejectors 240 can be in various arrangements and orientations, according to various embodiments of the invention.

Computer/workstation 290 is configured to receive IC layout data from a data source 291, and then provide appropriate control signals to printing support structure 280 and/or stage 210. Data source 291 can comprise any source of IC layout data, including a networked computer, a layout database connected via a local area network (LAN) or wide area network (WAN), or even a CD-ROM or other removable storage media. The control signals provided by computer/workstation 290 control the motion and printing action of print head 230 as it is translated relative to the substrate 220. Note that the printing action can be provided by printing support structure 280, by stage 210, or by both in combination. Note further that the printing action does not have to involve actual movement of the print head itself, as print head 230 could be held stationary while stage 210 translates substrate 220. Computer/workstation 290 is also coupled to receive and process imaging data from camera 270. As will be described subsequently, camera 270 can provide both manual and automated calibration capabilities for printing system 200.

To obtain the desired IC pattern results from printing system 200, the IC layout data must be appropriately processed, print head 230 must be properly configured, and print head 230 must be accurately aligned and calibrated with respect to stage 210.

IC Layout Data Processing

As noted previously, conventional IC printing systems typically produce multi-pass features that exhibit problematic edge scalloping (and the associated undesirable electrical properties). According to an embodiment of the invention, the need to print multi-pass features can be minimized or eliminated by separating the source IC layout into design layers that only include parallel layout features. An IC layout is typically well suited to this sort of division, since most conventional circuitry is formed using orthogonal rectangular features. Current flow typically follows those orthogonally oriented features, making electrical continuity in those directions particularly important with regard to device performance.

Parsing the IC layout into design layers having parallel layout features eliminates multi-pass features by allowing the print direction of the IC printing system to always be aligned with the layout features being printed. As described previously, printing in a direction parallel to an IC layout feature allows the deposited print solution droplets to fully coalesce, such that the resulting IC pattern feature is smooth-edged and structurally homogenous. Note that computer/workstation 290 could perform this IC layout separation operation, or IC layout data source 291 could provide "pre-separated" layout data to computer/workstation 290.

Figure 3A:
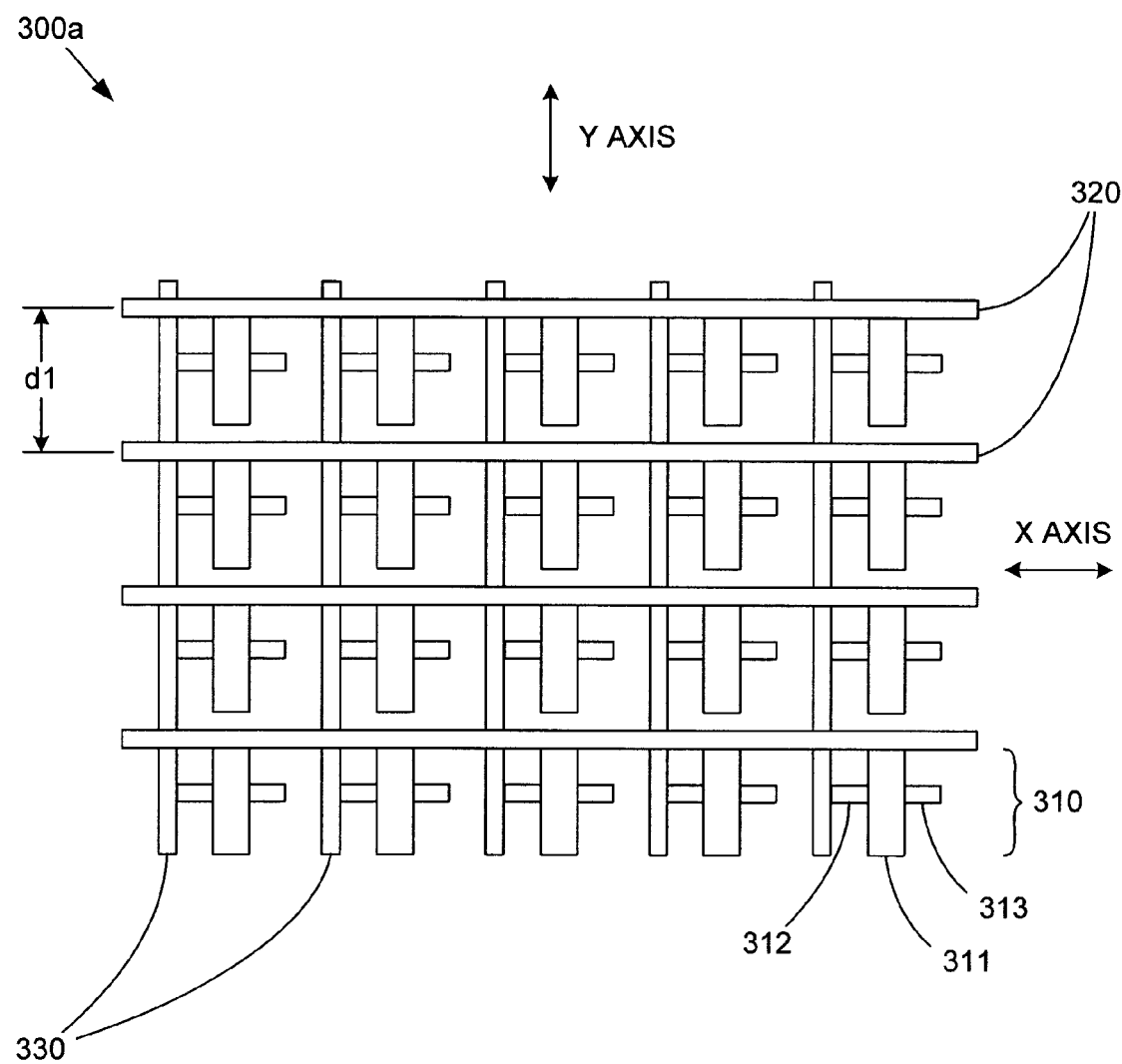
FIG. 3a is a sample IC layout.

FIG. 3a shows an example IC layout 300a that includes an array of transistor elements 310 interconnected by multiple address line elements 320 and word line elements 330. Each of transistor elements 310 includes a gate element 311, a drain element 312, and a source element 313. Because IC layout 300a includes layout features running parallel to both the X axis and the Y axis, printing IC layout 300a using conventional IC printing systems would result in the printing of multi-pass features, regardless of whether the print direction was parallel to the X axis or parallel to the Y axis. The invention avoids this problem by separating IC layout 300a into multiple design layers, such as design layers 300b and 300c, shown in FIGS. 3b and 3c, respectively. Design layer 300b in FIG. 3b includes all the word line elements 330 of IC layout 300a, which run parallel to the Y axis, while design layer 300c in FIG. 3c includes all the address line elements 320 of IC layout 300a, which run parallel to the X axis. Note that the terms "X axis" and "Y axis" as used herein merely describe two orthogonal axes, and do not specify any absolute frame of reference.

Once design layers 300b and 300c have been extracted from IC layout 300a, the word and address lines of the final IC pattern can be printed in two separate printing operations. In a first printing operation, the print direction can be set parallel to the Y axis to print design layer 300b onto a substrate. Because design layer 300b only includes layout elements that run parallel to the Y axis, setting the print direction parallel to the Y axis will result in smooth-edged, structurally homogenous printed features providing good electrical continuity. In a second printing operation, the print direction can be set parallel to the X axis to print design layer 300c onto the substrate. Because design layer 300c only includes layout elements that run parallel to the X axis, setting the print direction parallel to the X axis will again result in smooth-edged, structurally homogenous printed features providing good electrical continuity. The order of printing could be reversed, so long as the print direction associated with each design layer is maintained. In a similar manner, drain elements 312 and source elements 313 could be printed by a third printing operation having a print direction parallel to the X axis, while gate elements 311 could be printed by a fourth printing operation having a print direction parallel to the Y axis.

The "print direction," as used herein, refers to a specific axis relative to the substrate along which printing occurs. Therefore, two different print directions are associated with the first and second printing operations described above. This is true even if the print travel axis (i.e., the axis of movement of the print head relative to the printing system), or print travel axes, remain the same for both the first and second printing operations. As long as the rotational orientation of the substrate relative to the print head is different during the first and second printing operations, the two printing operations will have different print directions. Note further that since the "print direction" refers to an axis, both positive and negative motion along that axis are considered to be considered to have the same the print direction. Also note that the print direction can comprise a curvilinear geometry (i.e., a non-straight-line axis) specifying a planar or non-planar path. Furthermore, while an IC layout may not be divisible into design layers having only parallel layer features, so long as substantially all (generally 90% or more) of the layout features in a particular layer are parallel to one another, a significant benefit can be achieved.

Figure 1A:
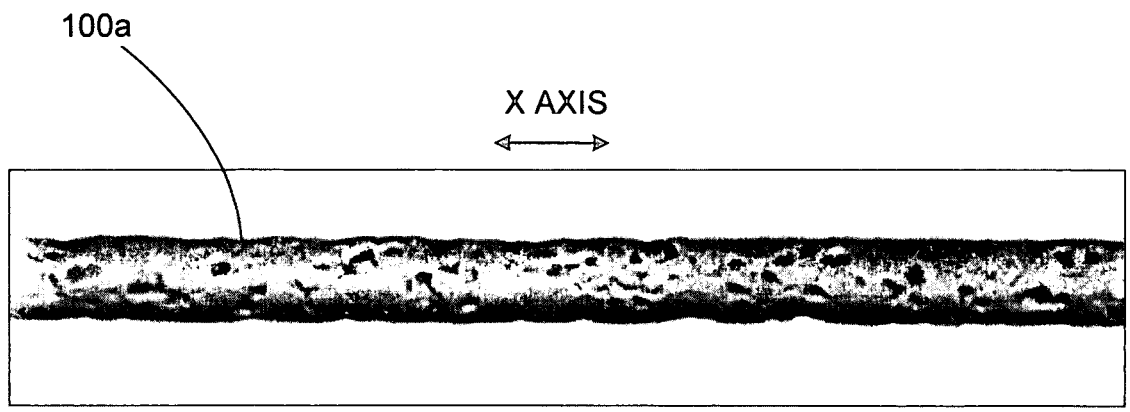
FIG. 1a is a photograph of a printed feature exhibiting smooth edges and homogeneity.
Figure 1B:
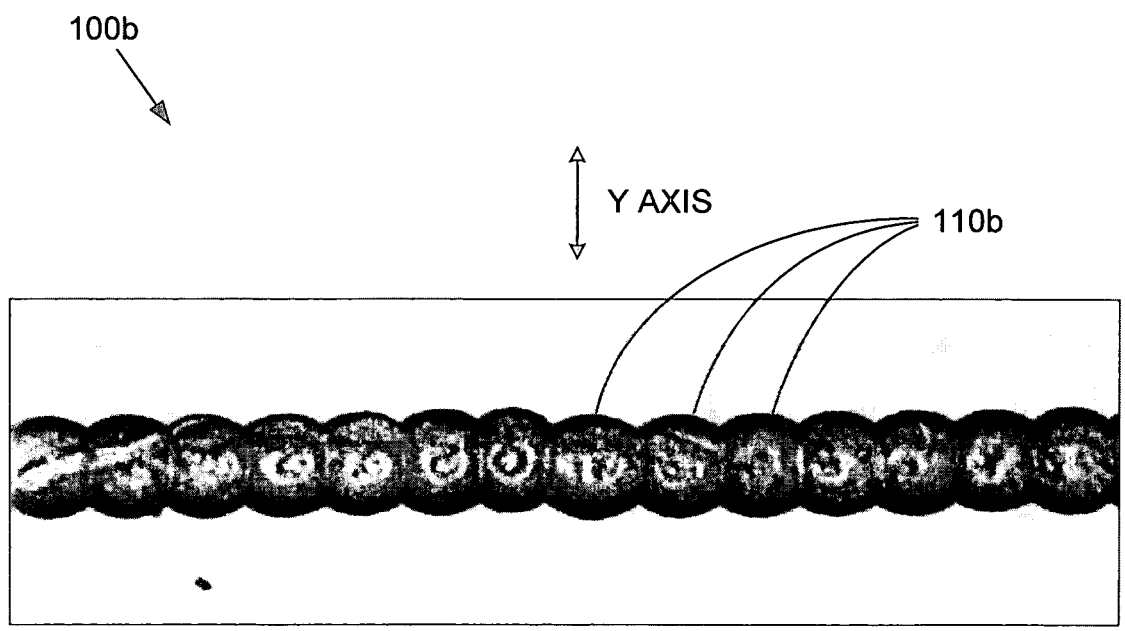
FIG. 1b is a photograph of a printed feature exhibiting scalloped edges.
Figure 1C:
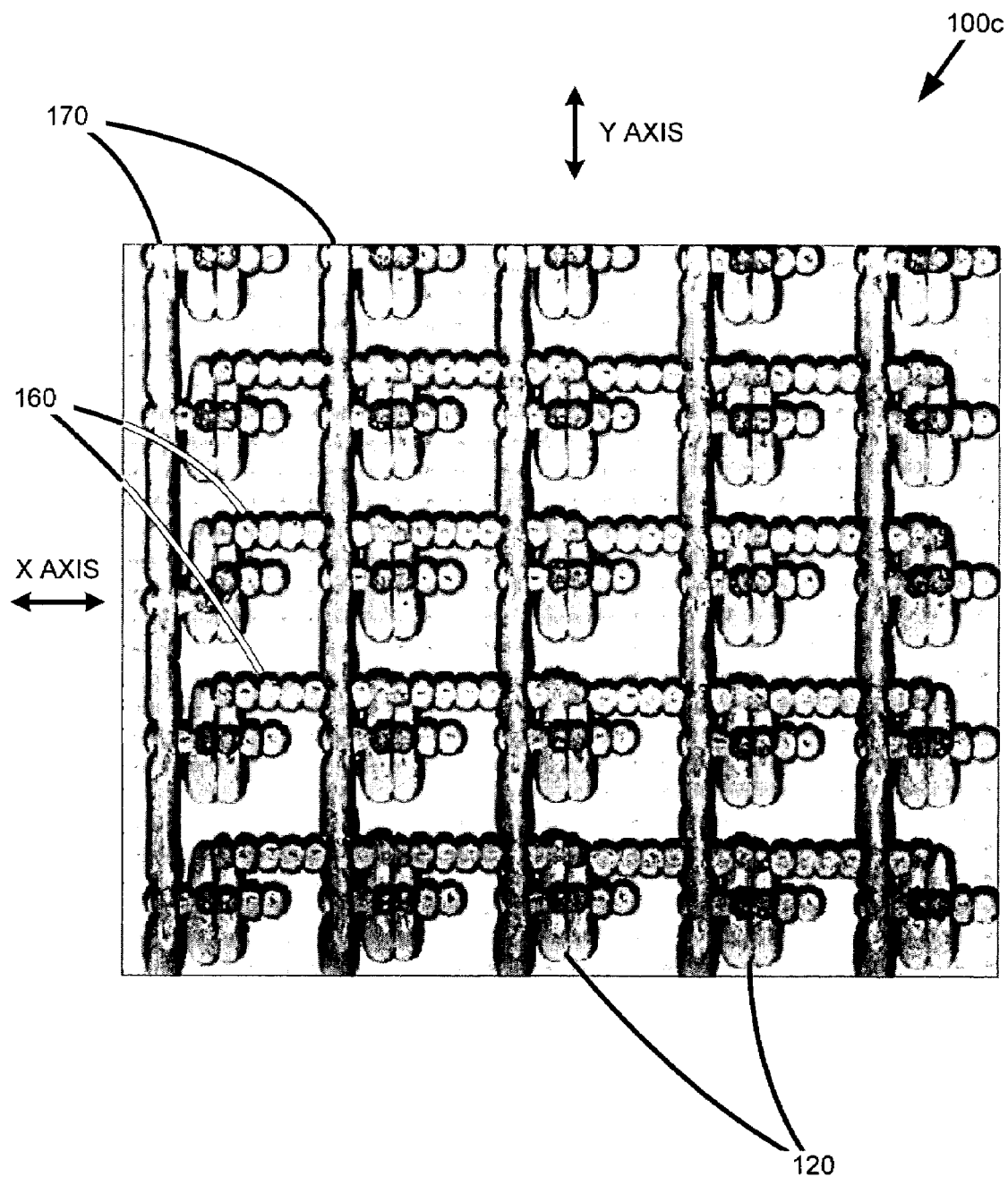
FIG. 1c is a photograph of an IC pattern including features having smooth edges and features having scalloped edges.
Figure 3B:
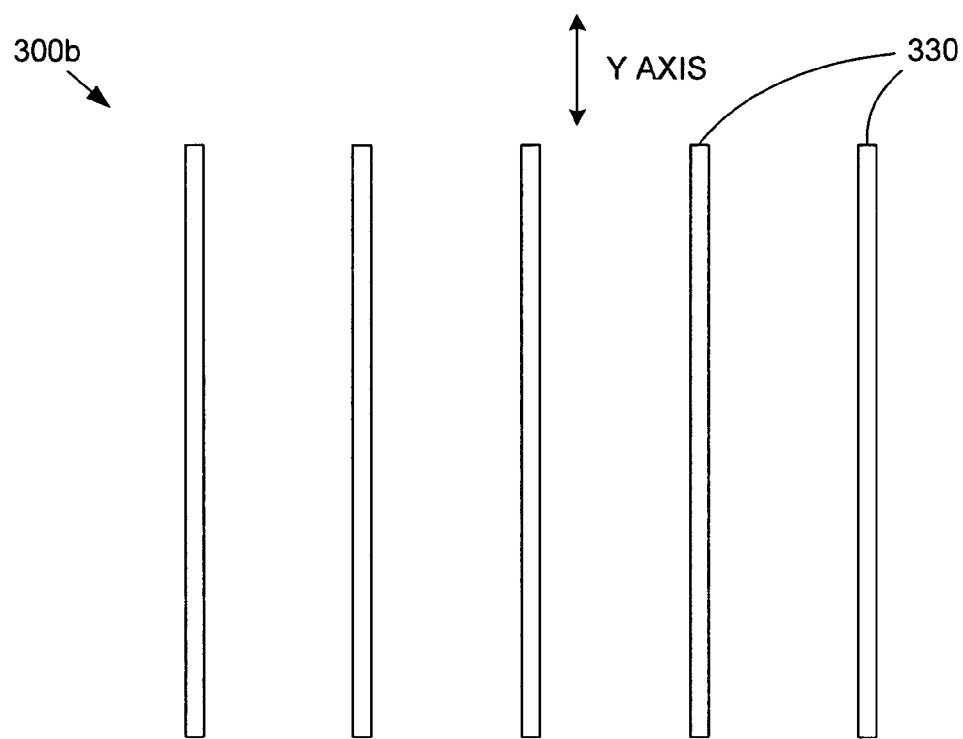
FIGS. 3b and 3c are design layers taken from the sample IC layout of FIG. 3a, in which all the layout elements are parallel to one another, according to another embodiment of the invention.
Figure 3C:
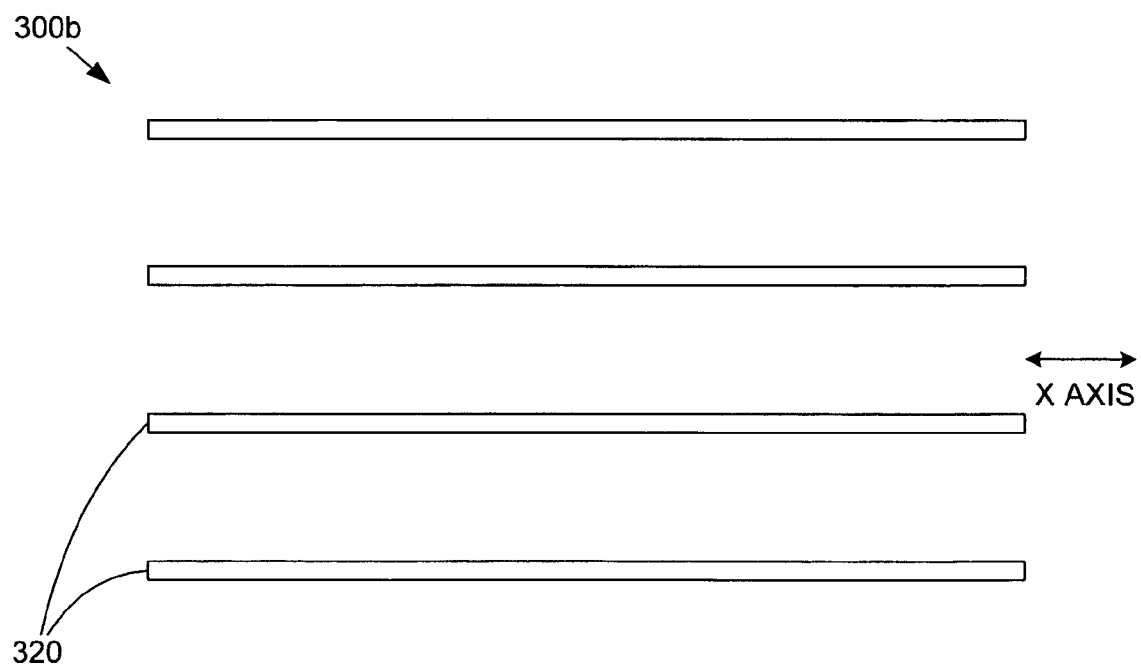
Figure 3D:
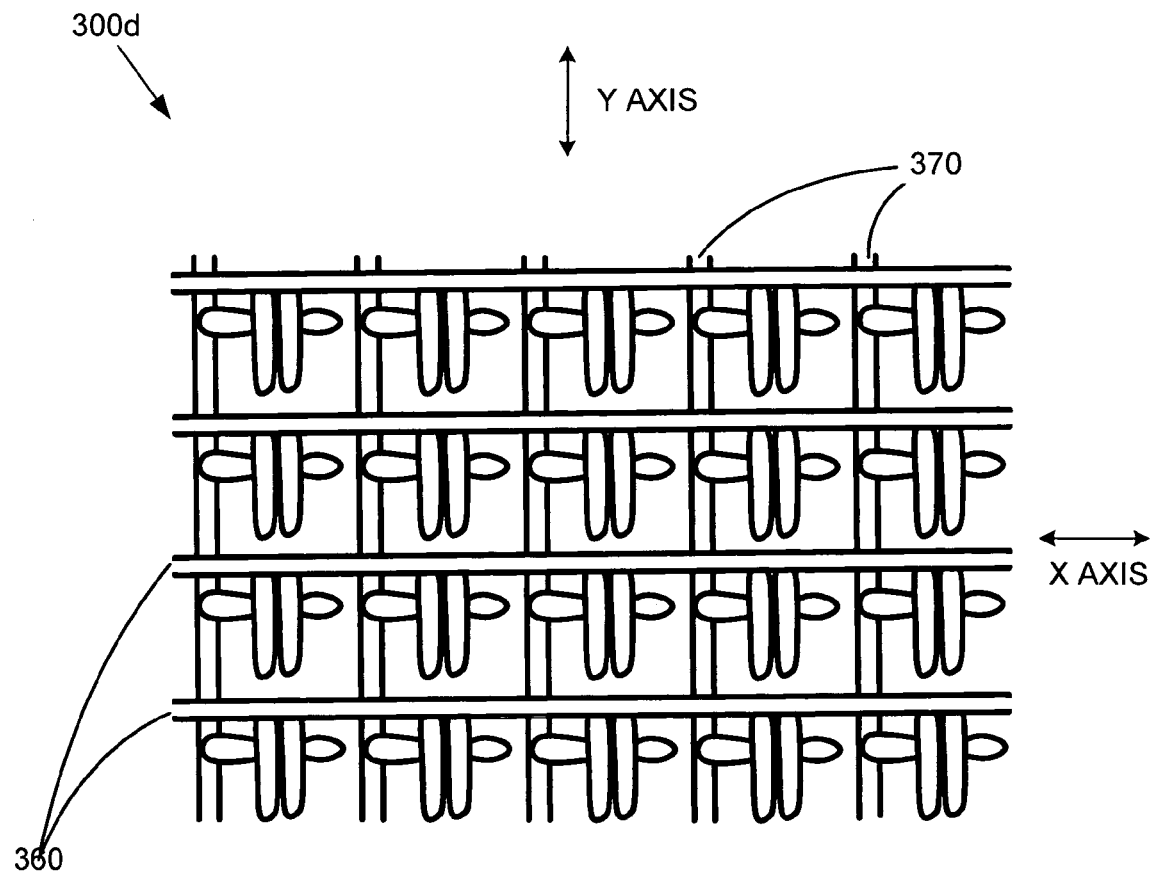
FIG. 3d is a photograph of an IC pattern formed using the design layers shown in FIGS. 3b and 3c, according to another embodiment of the invention.

FIG. 3d shows a photograph of an IC pattern 300d that could be printed from design layers 300b and 300c in FIGS. 3b and 3c, respectively. Note that word lines 360 of IC pattern 300d, which were formed by a printing operation having a print direction parallel to the Y axis, all exhibit the desired smooth edges and homogeneity previously described with respect to printed feature 100a shown in FIG. 1a. Similarly, note that address lines 370, which were formed by a printing operation having a print direction parallel to the X axis, are likewise smooth-edged and homogenous. In this manner, division of IC layouts into appropriate design layers can enable improved printing of IC patterns. Contrast the smooth-edges of IC pattern 300d with the scalloped edges of IC pattern 100c shown in FIG. 1c, which was formed using a conventional printing method.

Print Head Configuration

Beyond dividing the IC layout into design layers having parallel layout features, the IC printing process can be further optimized through proper configuration of the print head. According to an embodiment of the invention, printing throughput can be enhanced by spacing the ejectors in the print head according to the design rules of the IC pattern being printed. For example, FIG. 4a shows a facing view (i.e., looking directly into the ejectors) of a print head 430a. Print head 430a includes ejectors 440(1)-440(5) mounted in an ejector base 431a. Note that while five ejectors are shown for explanatory purposes, print head 430a could include any number of ejectors. Print head 430a is designed to print in the X axis direction, as ejectors 440(1)-440(5) are arranged in a vertical line. By sizing a spacing Ha between ejectors 440(1)-440(5) to be an integer multiple of a selected one of the design rules of a particular IC layout, print head 430a can be optimized for efficient printing of that IC layout.

For instance, IC layout 300a shown in FIG. 3a could include a design rule specifying the minimum spacing between address lines to be 338 um, in which case the spacing dl between address line elements 320 could be 338 um. By setting spacing Ha of print head 430a to equal 338 um, only a single pass of print head 430a across the substrate would be required to print design layer 300c shown in FIG. 3c. During the printing pass, each of ejectors 440(1)-440(4) would print one of address line elements 320. (Note that ejector 440(5) could be disabled during the printing pass, since it would never correspond to any of the layout features in design layer 300c.) Therefore, by incorporating an appropriate ejector spacing into print head 430a, the total number of passes required to print a given IC layout can be minimized. According to another embodiment of the invention, a similar printing efficiency could be obtained by specifying a design rule(s) for an IC layout that matches the (known) spacing of ejectors in the print head to be used in the printing of the IC layout.

Note that in order to print an orthogonal pair of design layers (such as design layers 300b and 300c shown in FIGS. 3b and 3c), a print head such as print head 430a would require a 90 degree reorientation relative to the substrate between printing operations (either by rotating the print head or rotating the substrate). The print heads used in conventional IC printing systems would also require this sort of rotational reorientation between printing operations since conventional IC printing systems typically use the same type of print heads that are used in inkjet printers (such as those manufactures by Epson, Hewlett Packard, Tektronics, Xerox, etc.), which are optimized for printing along a single print travel axis (since the print head in an inkjet printer only moves along a single axis during drop ejection). This type of inter-layer rotation can introduce undesirable operational complexity and an increased potential for misalignment into the IC printing process. According to another embodiment of the invention, the need for print head/substrate rotation between printing operations can be eliminated by configuring the print head to be a bi-axial print head.

FIG. 4b shows a bi-axial print head in accordance with another embodiment of the invention. Print head 430b includes multiple ejectors 440 arranged in a diagonal line across an ejector base 431b. Note that while six ejectors are shown for explanatory purposes, print head 430b could include any number of ejectors. The diagonal ejector arrangement of print head 430b allows multi-line printing to be performed in both the X axis and Y axis directions without print head or substrate rotation. Note that the throughput capability of print head 431b can be further optimized by setting the horizontal spacing Hb and the vertical spacing Wb between ejectors 440 according to the design rules of the IC layout being printed, as described previously with respect to print head 430a shown in FIG. 4a.

Print head 430b can be further optimized by repeating the diagonal line of ejectors in orthogonal directions, but offsetting each repeated line by a specified increment to cut down on the number of passes required to fill out an IC pattern. For example, FIG. 4c shows a print head 430c that includes five diagonal lines (D1-D5, shown as dotted lines for reference) of four ejectors 440 each. Note that both the quantity of diagonal lines and the number of ejectors per line have been arbitrarily selected for explanatory purposes, and print head 430c could include any number of diagonal lines and ejectors. For printing in the X-axis direction, diagonal lines D1-D3 are offset from one another in the vertical direction by a distance Hc. Offset Hc is selected such that each ejector 440 in diagonal lines D1-D3 has a unique vertical position and can therefore produce distinct (i.e., non-overlapping) horizontal lines when the print direction of print head 430c is parallel to the X axis. Similarly, for printing in the Y-axis direction, diagonal lines D3-D5 are offset from one another in the horizontal direction by a distance Wc. Offset Wc is selected such that each ejector 440 in diagonal lines D3-D5 has a unique horizontal position and can produce distinct vertical lines when the print direction of print head 430c is parallel to the Y axis. In this manner, the printing resolution (i.e., the printable spacing between adjacent lines) of print head 430c can be significantly enhanced.

System Calibration

Figure 11:
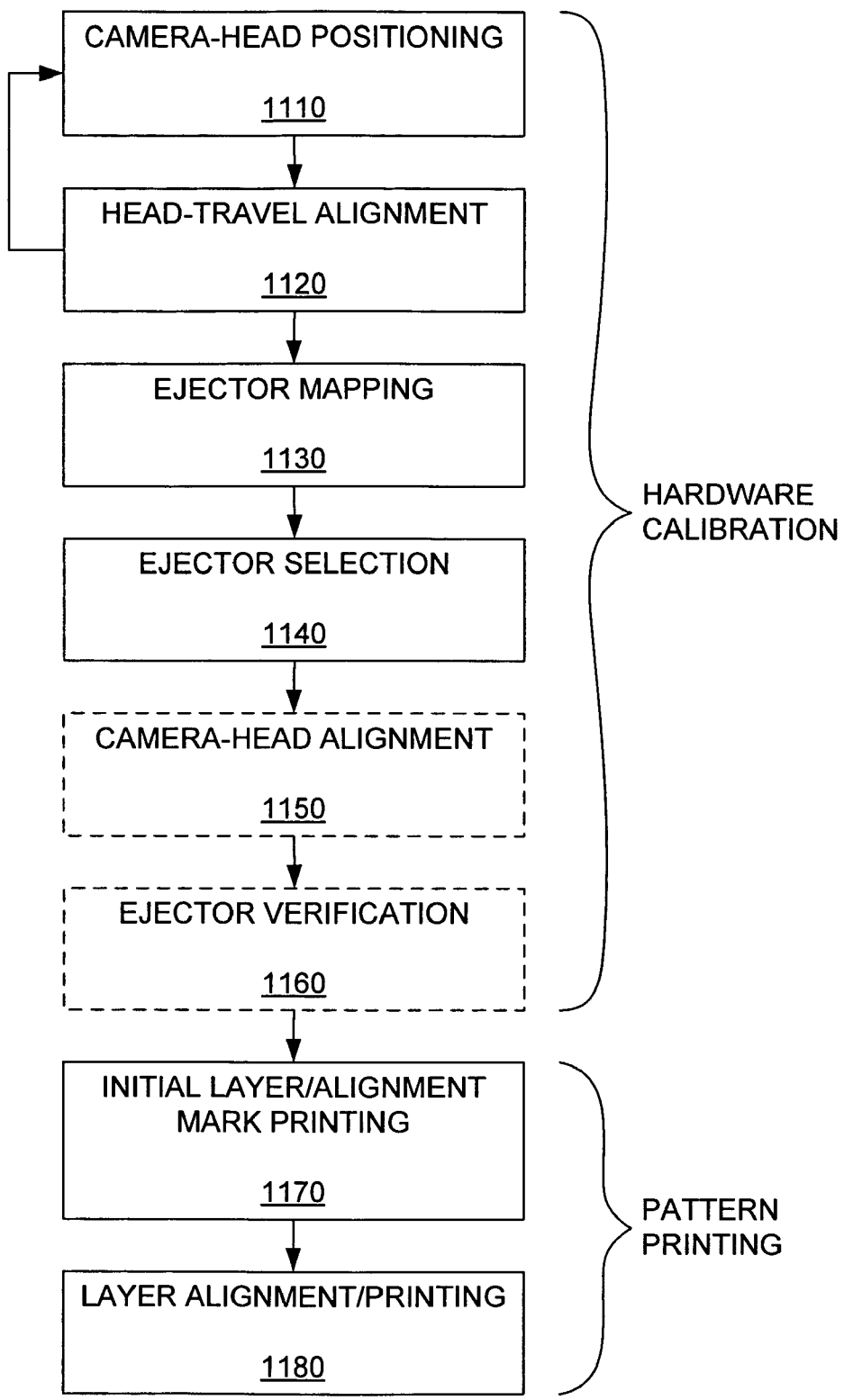
FIG. 11 is a flow diagram of a calibration and printing process for a printing system according to another embodiment of the invention.

To ensure accurate IC pattern formation, proper calibration of the IC printing system is important. Even state of the art inkjet printing heads and ejectors, such as those made by Spectra, Inc., may only provide an ejector-to-ejector spot placement accuracy of 50 um, whereas a more desirable accuracy for the formation of electronic patterns is in the range of 1 um. Therefore, calibration techniques that can enhance the "off the shelf" performance of print heads are desirable. As noted previously, system calibration can be readily accomplished with a video camera microscope (such as camera 270 shown in FIG. 2) having an optical axis position that is fixed relative to the ejector positions of the print head. FIG. 11 shows a flow chart of a calibration and printing process in accordance with an embodiment of the invention. In step 1110, the position of the ejectors relative to the camera is determined. Then in step 1120, the print head is aligned with the print travel axis (or axes) of the printing system. Note that adjustments made in step 1120 can require repetition of the camera-head positioning of step 1110. In step 1130, the "in use" positions of the ejectors (taking into account thermal expansion of the print head) are determined. In step 1140, the ejectors are selection-filtered so that only those ejectors providing a desired degree of printing accuracy are used in the printing process. If the ejector(s) used in the camera-head positioning of step 1110 are not selected to be used in step 1140, another camera-head positioning operation is performed in step 1150 using an ejector(s) selected in step 1140. An optional verification step 1160 can then be performed using those ejectors selected in step 1140 to verify that the proper printing accuracy is provided by the calibrated printing system. During an actual pattern printing operation, a first design layer is printed along with a set of alignment marks in step 1170. All subsequent design layers are then aligned and printed in step 1180. Note that various other embodiments of the invention can include any combination of the steps shown in FIG. 11. The individual steps in the flow chart of FIG. 11 are discussed in greater detail below.

Camera-Head Positioning (Step 1110)

The first step in any calibration operation using such a camera requires that the position of the camera relative to the print head be accurately determined. This "camera-to-printhead position" determination can be readily made since both the camera and print head are held in fixed positions relative to each other. For example, FIG. 5*a* (to be discussed in greater detail subsequently) shows a camera 570 and print head 531 mounted in a print assembly 550. One way to determine the position of camera 570 relative to a selected ejector (e.g., ejector 540(0)) is to print a spot (e.g., 525(0)) from the selected ejector and measure the horizontal offset Ch and vertical offset Cv required to position a reference mark 571 in the imaging area of camera 570 directly over the spot. Various other methods will be readily apparent.

Head-Travel Alignment (Step 1120)

Figure 5A:
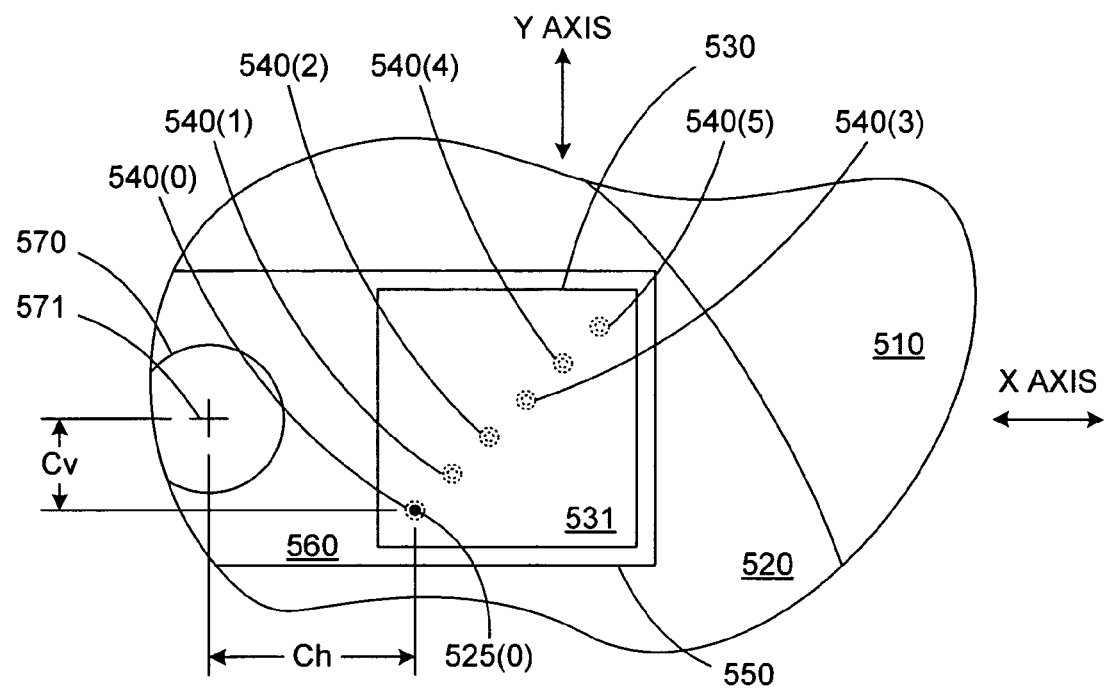
FIGS. 5a and 5b are diagrams of a print head to print travel axis alignment process according to another embodiment of the invention.
Figure 5B:
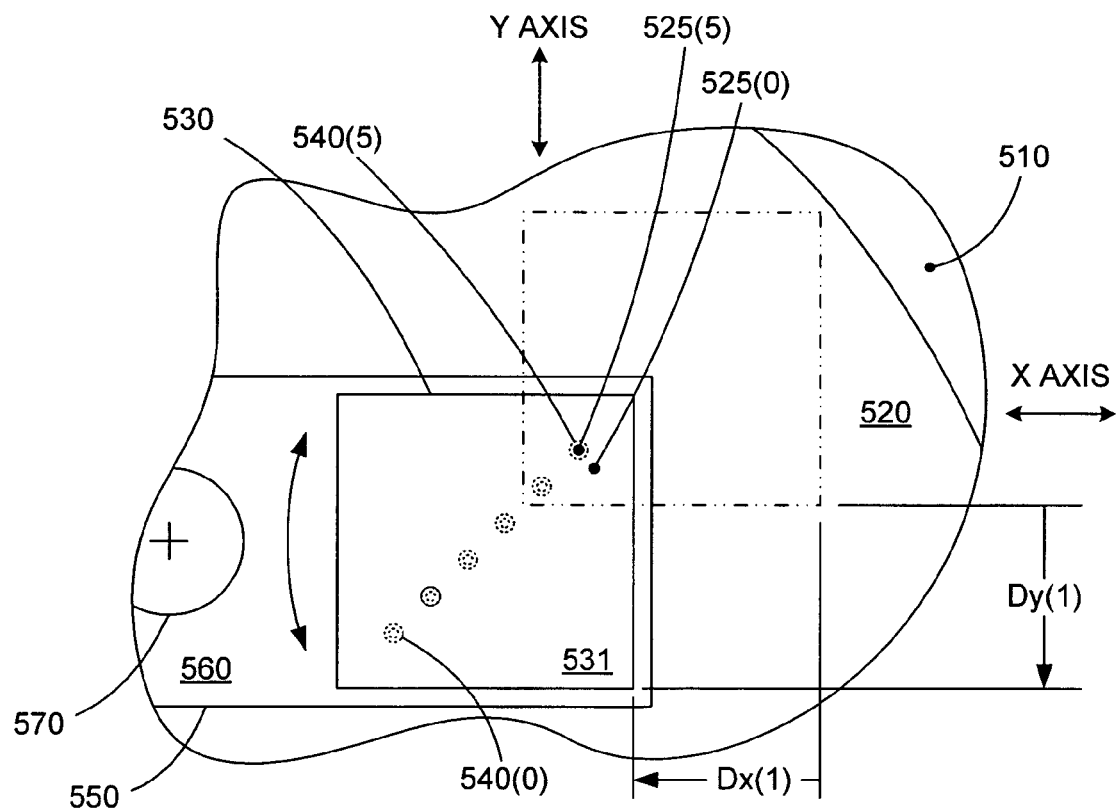
Figure 5C:
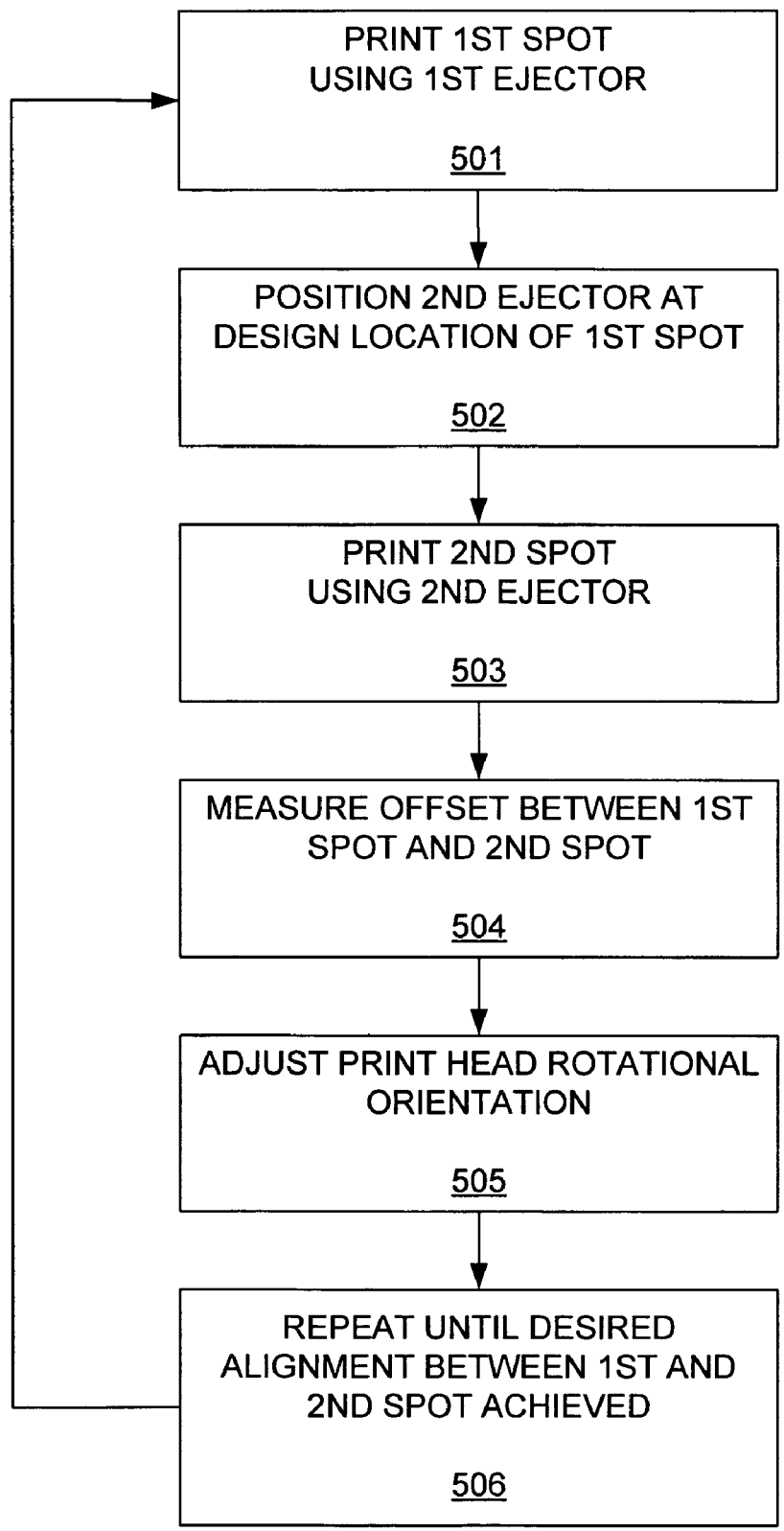
FIG. 5c is a flow diagram of the print head to print travel axis alignment process shown in FIGS. 5a and 5b, according to another embodiment of the invention.

A print head having multiple ejectors must be accurately aligned with the print travel axis (axes) of the IC printing system in which it is used, so that a drop of print solution can be placed at any required position on a substrate within a desired accuracy. If there is angular misalignment between the print head relative to the print travel axis, the IC pattern produced by the print head will exhibit a corresponding amount of distortion. FIGS. 5*a* and 5*b* provide detail views of an IC printing system that depict a method for performing this print head to print travel alignment according to an embodiment of the invention. In FIG. 5*a*, a print assembly 550 is positioned over a substrate 520 on a stage 510. Print assembly 550 is substantially similar to print assembly 250 shown in FIG. 2, and includes a print head 530 and a camera 570 mounted in a rigid mount 560. Print head 530 comprises ejectors 540(0)-540(5) arranged in a diagonal line in an ejector base 531. Note that while six ejectors are depicted, print head 530 can include any number and arrangement of ejectors. A single spot 525(0) is printed on substrate 520 by a first selected one of ejectors 540(0)-540(5)—in this case ejector 540(0). Then, as shown in FIG. 5*b*, print assembly 550 is translated by a distance Dx(1) in the X axis direction and a distance Dy(1) in the Y axis direction, with distances Dx(1) and Dy(1) representing the values expected to position a second selected ejector (in this case ejector 540(5)) over spot 525(0). Ejector 540(5) then prints a second spot 525(5). Camera 570 can then be used to measure the distance between spots 525(0) and 525(5), and the orientation of print head 530 can be adjusted with respect to substrate 520 (or stage 510) to compensate for the misalignment. Note that this relative rotation of print head 530 can be accomplished by actually rotating print head 530 within fixed mount 560 (as indicated by the curved arrow), or by leaving the position of print head 530 unchanged and rotating stage 510. After recalibrating the camera to ejector/drop location, the two ejectors (530(0) and 530(5)) can then be used to print two more drops at a single location to determine if further rotational correction is required. This type of iteration can be continued until the spots produced by the two ejectors align within a desired degree of accuracy. This process is summarized in steps 501-506 of the flow chart shown in FIG. 5*c*.

Figure 6A:
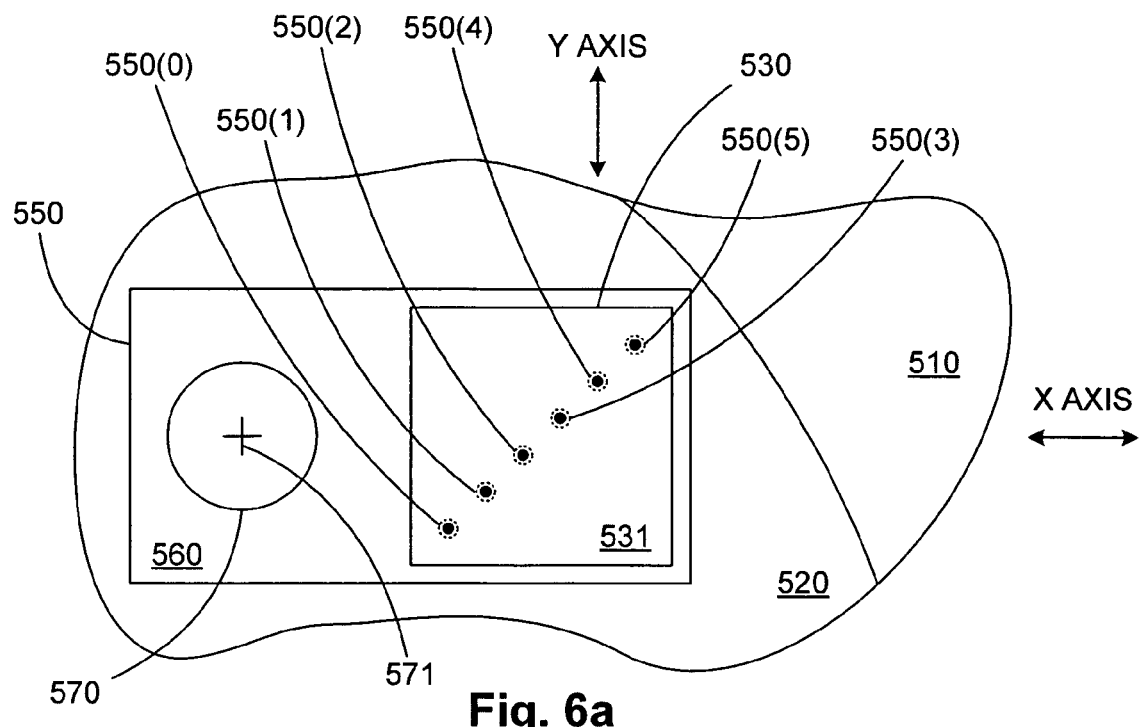
FIGS. 6a and 6b are diagrams of a print head to print travel axis alignment process according to another embodiment of the invention.
Figure 6B:
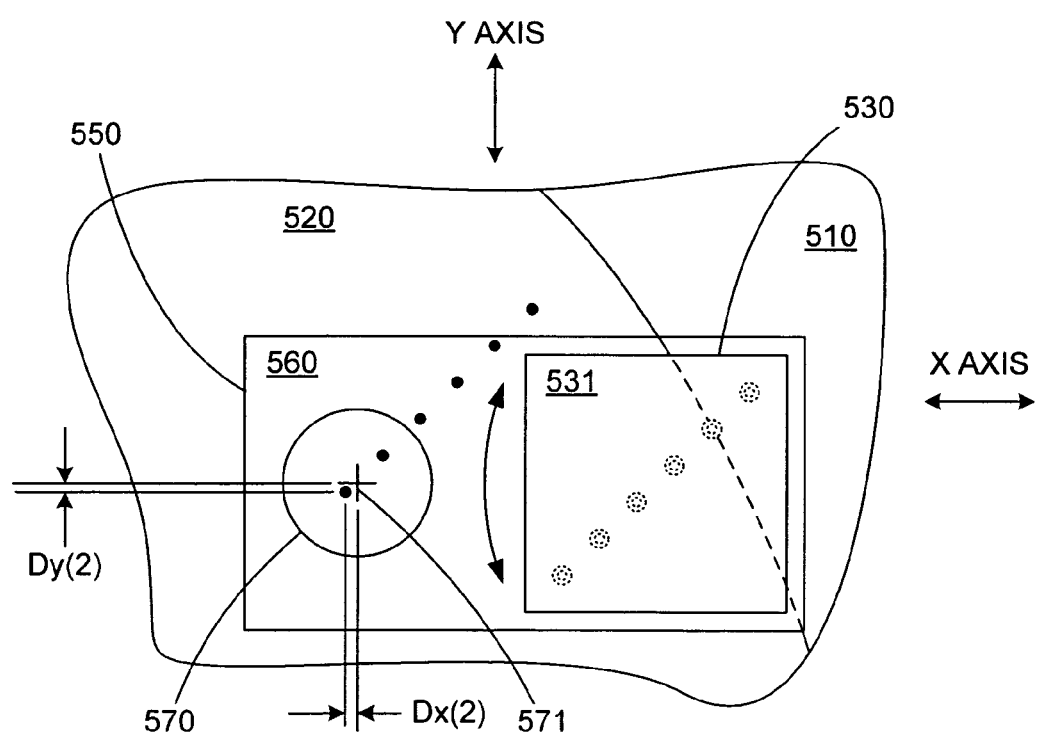
Figure 6C:
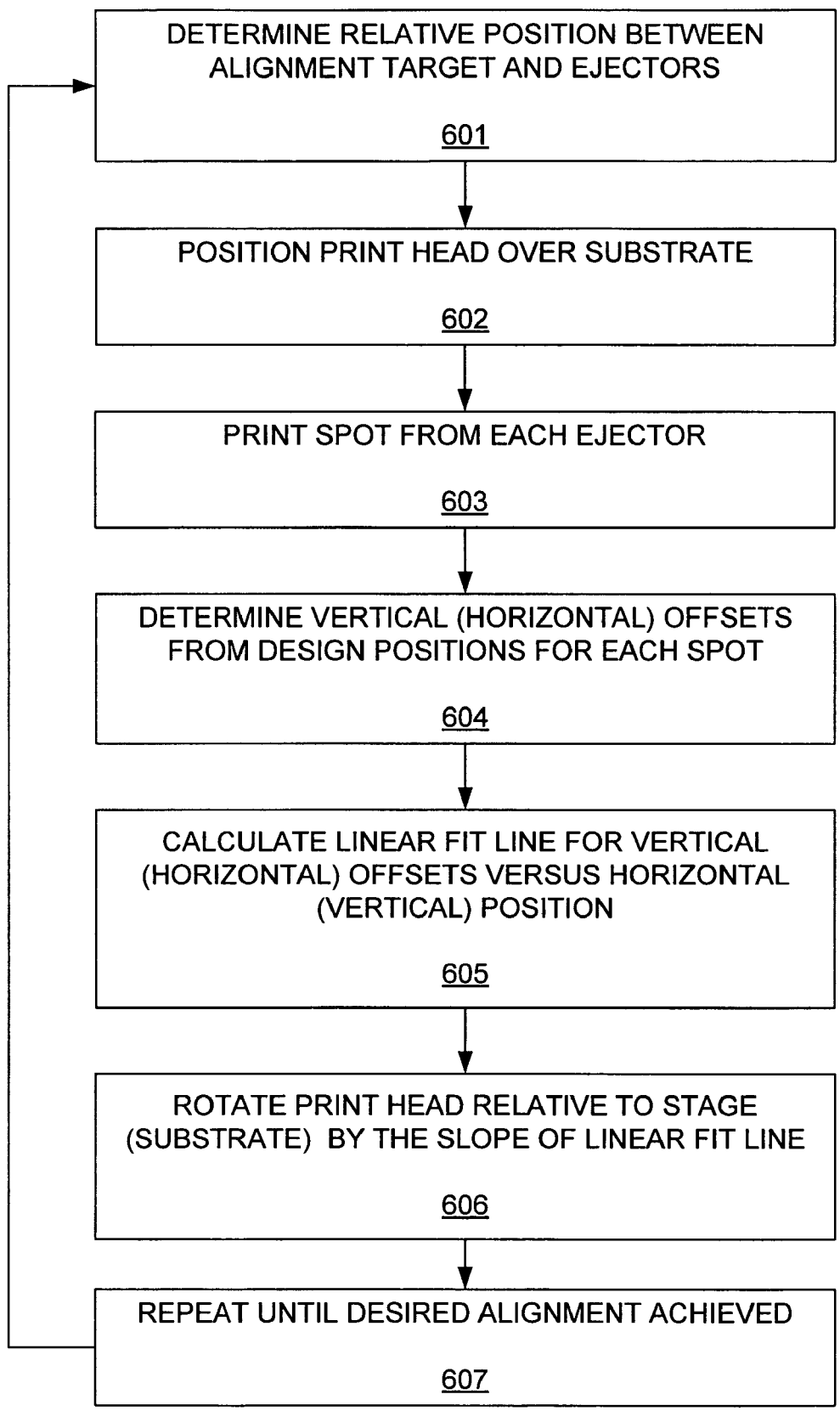
FIG. 6c is a flow diagram of the print head to print travel axis alignment process shown in FIGS. 6a and 6b, according to another embodiment of the invention.
Figure 7:
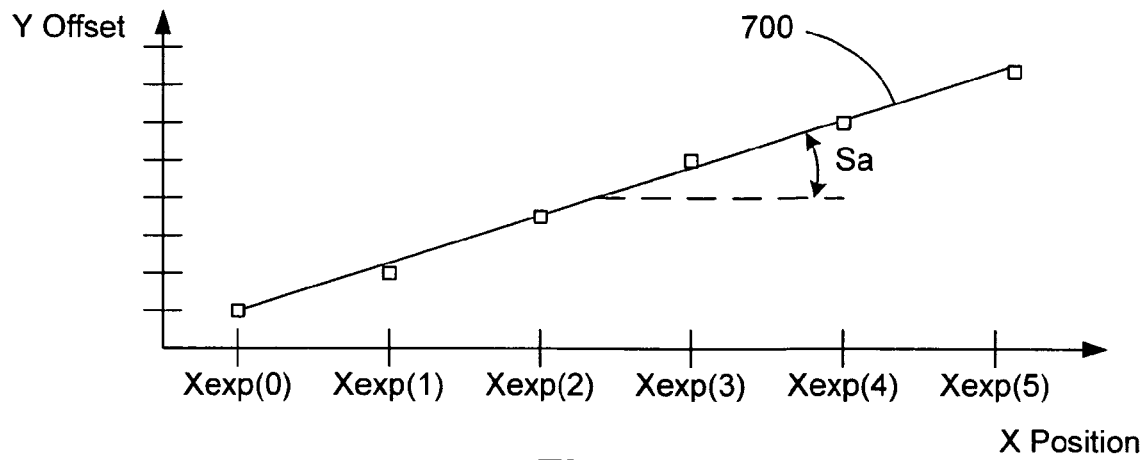
FIG. 7 is a graph of rotational misalignment for use in a stage to print head alignment process according to another embodiment of the invention.

FIGS. 6*a* and 6*b* provide detail views of an IC printing system that depict an alternative method for performing a print head to print travel alignment operation, according to another embodiment of the invention. In FIG. 6*a*, a print assembly 550 is positioned over a substrate 520 on a stage 510. Print assembly 550 is substantially similar to print assembly 250 shown in FIG. 2, and includes a print head 530 and a camera 570 mounted in a rigid mount 560. Print head 530 comprises ejectors 540(0)-540(5) arranged in a diagonal line in an ejector base 531. Note that while six ejectors are depicted, print head 530 can include any number and arrangement of ejectors. The position of each ejector 550(0)-550(5) relative to an alignment target 571 within the imaging sensor of camera 570 is accurately determined, a relatively straightforward task since both the camera and ejectors 550(0)-550(5) are held in fixed positions by rigid mount 560. Then, as depicted in FIG. 6*a*, a single drop of print solution is deposited from each of ejectors 550(0)-550(5) onto substrate 520 in a single ejection event. This ejection event can be performed at the printing speed to be used during actual IC printing so that any effects due to variations in ejection velocity can be accounted for. For each ejected spot, camera 570 is positioned over the design position (i.e., expected position) of the corresponding ejector, as shown in FIG. 6*b*, and using machine vision object location methods (such as a center of mass or circular Hough transform algorithm), the actual location of the spot is detected and the X axis and Y axis offsets (Dx(2) and Dy(2), respectively) of the spot from the design position are calculated. The Y axis offset for each spot can then be plotted against the expected X axis position of the spot (Xexp), as shown by the graph in FIG. 7. A best fit line 700 can then be calculated, wherein a slope Sa of line 700 indicates the angular difference between the print head 530 and the X-axis travel of stage 510. Note that the X axis offset for each spot plotted against the expected Y axis position of the spot would provide an alternative means for calculation of this angular difference. Print head 530 could then be rotated with respect to stage 510 to compensate for this misalignment. The entire procedure could then be repeated until the measured angular difference falls below a desired threshold angle. This process is summarized in steps 601-607 of the flow chart shown in FIG. 6*c*.

Ejector Mapping (Step 1130)

Figure 8A:
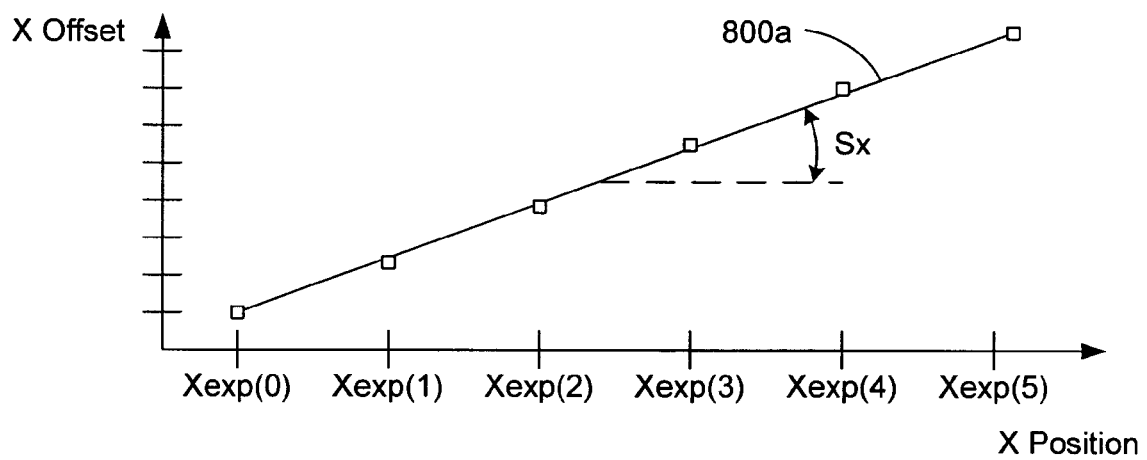
FIGS. 8a and 8b are graphs of horizontal and vertical misalignment that can be used to determine thermal effects on ejector position according to another embodiment of the invention.
Figure 8B:
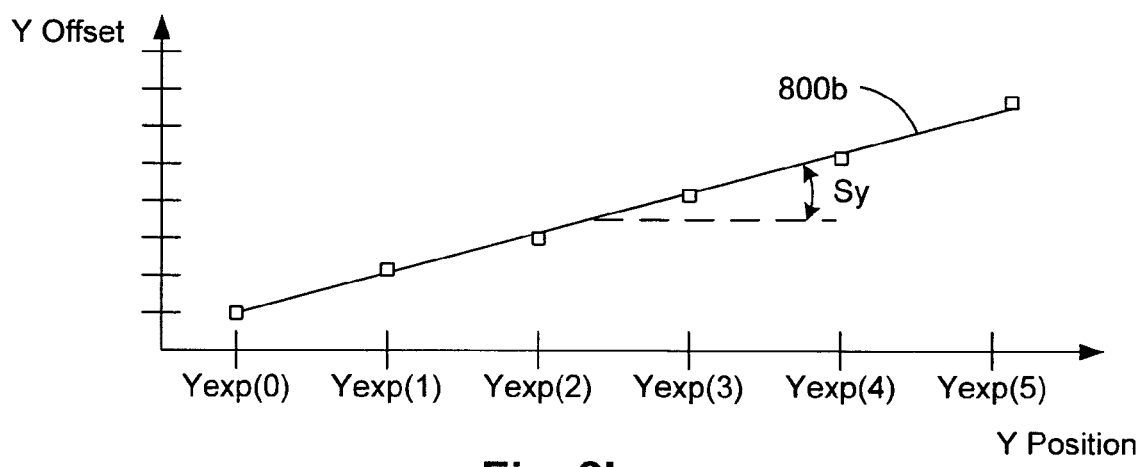
Figure 8C:
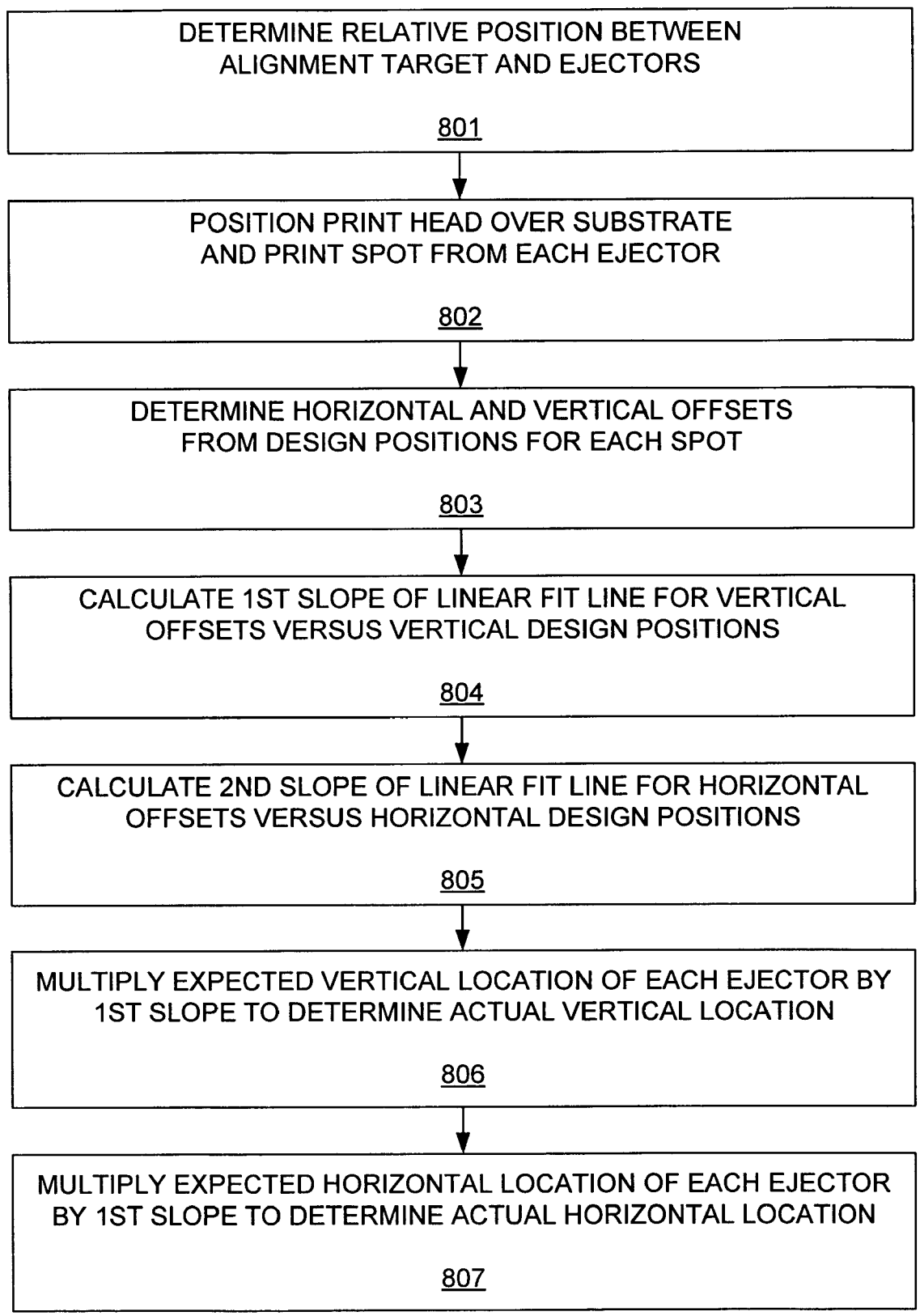
FIG. 8c is a flow diagram of an ejector mapping process according to another embodiment of the invention.

The X axis and Y axis offset data (the collection of which was described with respect to FIGS. 6*a* and 6*b*) can also be used to more accurately determine the spacing between ejectors in the print head during operation of an IC printing system. During printing operations, the print head often must be heated to ensure proper printing solution flow. The resulting thermal expansion of the print head can alter the ejector spacing from its design (expected) values. According to an embodiment of the invention, this thermally-induced offset can be measured and compensated for in the following manner. First, a set of X axis and Y axis offsets is determined as described previously with respect to FIGS. 6a and 6b. Then, X axis offset for each spot can then be plotted against the expected X axis position of the spot (Xexp), as shown by the graph in FIG. 8a. A best fit line 800a can then be calculated, wherein a slope Sx of line 800a defines a correction factor to be applied to the X axis design positions of the ejectors during actual print operations. The application of this correction factor is as follows:

$$Xact(n)=Xexp(n)+Sx*(Xexp(n)-Xexp(0)) \quad (1)$$

where Xact(n) is the actual X axis position of the nth ejector in a print head, Xexp(n) is the design (expected) X axis position of the nth ejector, and Xexp(0) is the design X axis position of a reference ejector in the print head (i.e., the ejector used in the aforementioned camera-to-print-head position determination). For example, for the graph of FIG. 8a, Xexp(0) would be the design X axis position of ejector 550(0) in FIGS. 6a and 6b. In a similar fashion, a slope Sy can be determined for a best fit line for a graph of Y axis offset for each spot plotted against the expected Y axis position of the spot (Yexp), as shown in FIG. 8b. Slope Sy provides a correction factor for the Y axis positions of the ejectors as follows:

$$Yact(n)=Yexp(n)+Sy*(Yexp(n)-Yexp(0)) \quad (2)$$

where Yact(n) is the actual Y axis position of the nth ejector in a print head, Yexp(n) is the design (expected) Y axis position of the nth ejector, and Yexp(0) is the design Y axis position of the reference ejector. In this manner, thermal effects on ejector position can be efficiently corrected. This process is summarized in steps 801-807 of the flow chart shown in FIG. 8c.

Ejector Selection (Step 1140)

The inherent difficulty in producing multi-ejector print heads having a large number of high-quality ejectors necessitates the use of ejector "selection-filtering" for high accuracy printing (e.g., 40 um drops placed with 1 um accuracy and drop uniformity <5%). This problem is only magnified when IC printing systems incorporate the readily available inexpensive print heads intended for document production. Often, only a subset of the ejectors in a print head can perform with the required accuracy (printing tolerance). In such situations, a method for ejector selection according to an embodiment of the invention involves: performing the camera to print head alignment procedure described above; performing the ejector-to-ejector position testing described above and applying the appropriate compensation to the layout data; selecting a spot placement accuracy tolerance and a spot size variation tolerance; identifying any other selection parameters unique to the print head design (i.e. collinear position redundancy, sparse outlier removal, etc.); and filtering for ejectors that provide the desired printing tolerances within the selection parameters. According to an embodiment of the invention, this filtering can be verified by printing an ejector pattern using all the filter-selected ejectors. The ejector pattern can be formed by a single ejection event or by a print operation that prints a predetermined pattern that utilizes all the selected ejectors. The spot placement for each ejector can then be compared to the selection parameters to identify those ejectors that provide the desired printing tolerances. Once these "good" ejectors have been selected and verified, the remaining ejectors can be disabled or removed from operation in subsequent printing operations.

Layer Alignment (Steps 1170 and 1180)

Because printing an IC pattern in accordance with the invention will require at least two print operations (i.e., one for each of the non-parallel design layers), some means must be provided for ensuring that the design layer used in the second print operation is aligned with the design layer printed in the first print operation. According to an embodiment of the invention, this alignment can be facilitated by printing a set of alignment marks on the substrate. Then the camera mounted in the print assembly (e.g., camera 270 shown in FIG. 2) can be used to perform a layer alignment so that the layers printed during different printing operations are properly aligned.

Figure 9A:
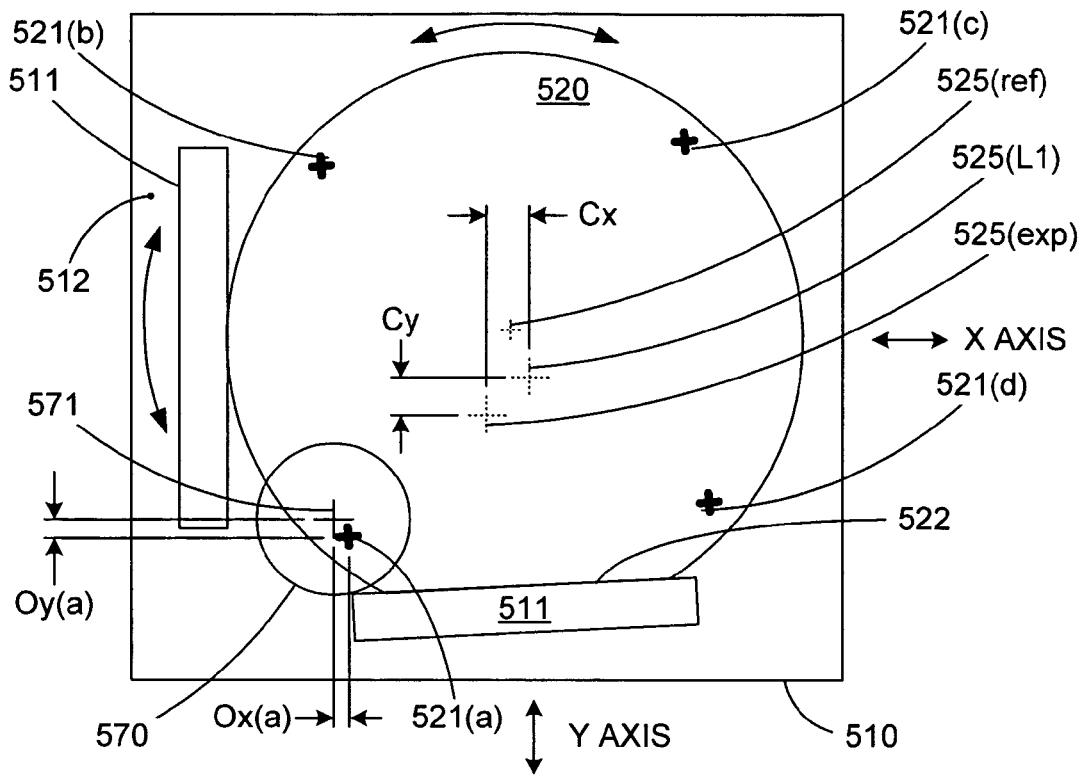
FIGS. 9a and 9b are diagrams of layer alignment processes according to other embodiments of the invention.

FIG. 9a depicts a method for performing this layer alignment according to an embodiment of the invention. In FIG. 9a, a substrate 520 is placed on a rotational platform 512 on a stage 510 and is positioned using standard positioning features such as a flat 522 on substrate 520 and alignment features 511 on stage 510. Alignment marks 521(a)-521(d) have previously been printed in unused locations on substrate 520, either prior to or during printing of the initial design layer. Alignment marks 521(a)-521(d) can be part of the initial design layer, or they can be included in a special alignment design layer. Note that while four alignment marks are depicted, any number of alignment marks (greater than one) could be printed on substrate 520. Note further that while alignment marks 521(a)-521(d) are depicted as cross-shaped elements for explanatory purposes, they can comprise any shape capable of accurately indicating position.

To perform the layer alignment, camera 570 is used to gauge the offset (i.e., a vector distance and direction) between the design position and actual position for each of alignment marks 521(a)-521(d). These measurements can be taken by moving camera 570 to the design position and then comparing the actual position of the associated alignment mark with an alignment target 571 in the imaging sensor of camera 570 (the print assembly that houses camera 570 and its associated print head are not shown for clarity). After each such measurement, or after a specified number of such measurements, substrate 520 is rotated by rotational platform 512 (as indicated by the curved arrows). This measurement-rotation sequence is repeated until the offsets for each of alignment marks 521(a)-521(d) are the same (within a specified tolerance).

Then, camera 570 measures the position of each reference mark with respect to a predefined origin point and averages those measurements to obtain the actual location of an alignment reference point for alignment marks 521(a)-521(d) (indicated as location 525(ref)). The alignment reference point has a known position relative to a design layer origin of the first design layer (indicated as location 525(L1)), so once the actual location of the alignment reference point is known, the actual location of the design layer origin of the first design layer can be determined. According to an embodiment of the invention, the alignment reference point and the design layer origin of the first design layer can be coincident. The X axis and Y axis offsets, Cx and Cy, respectively, between the actual location of the design layer origin of the first design layer and its expected position (indicated as location 525(exp)) provide a translation vector that can be applied to the next design layer to be printed so that it is aligned with substrate 520, and hence aligned with the previously printed layers. This process is summarized in steps 901-907 in the flow chart shown in FIG. 9c.

Figure 9B:
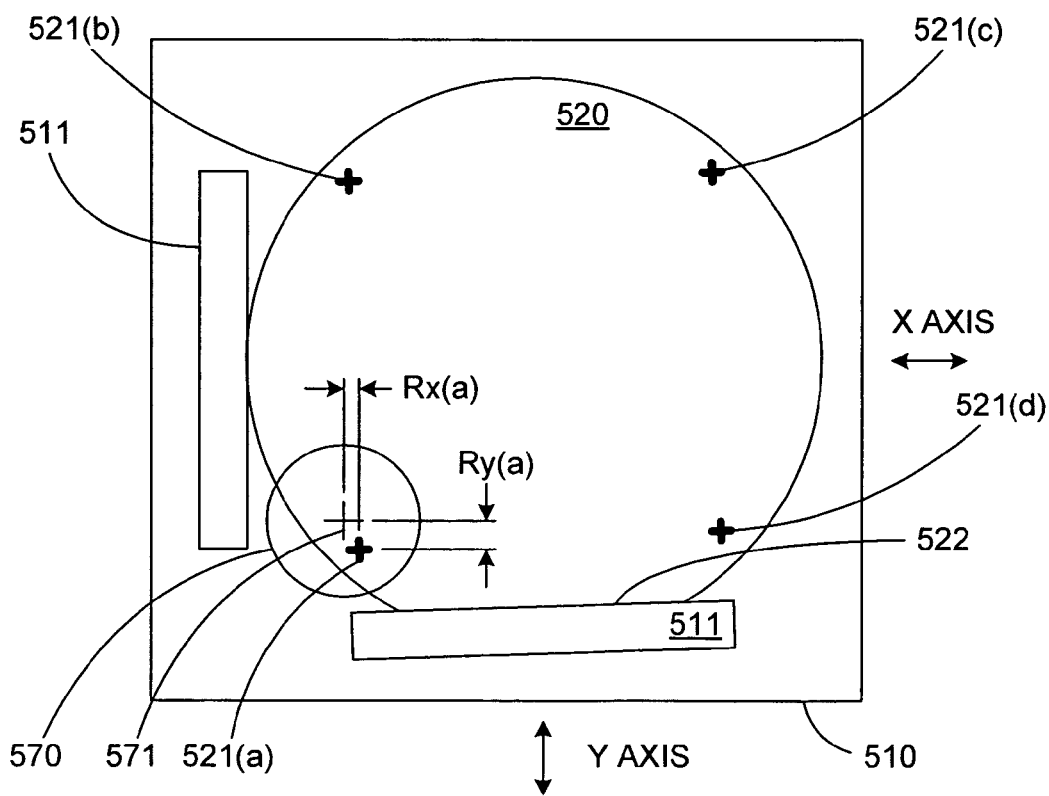
Figure 9C:
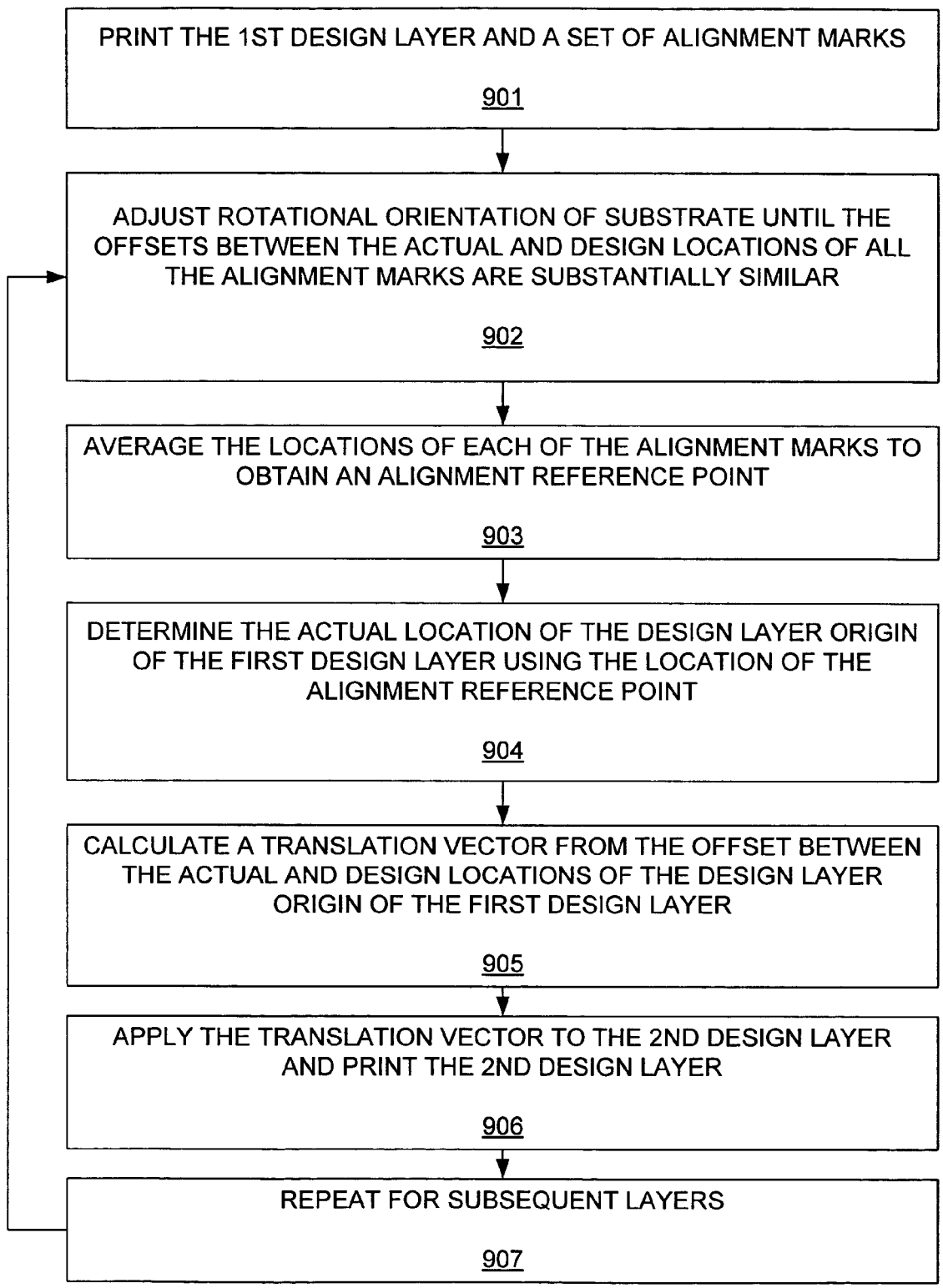
FIGS. 9c and 9d are flow diagrams of the layer alignment processes shown in FIGS. 9a and 9b, respectively, according to other embodiments of the invention.
Figure 9D:
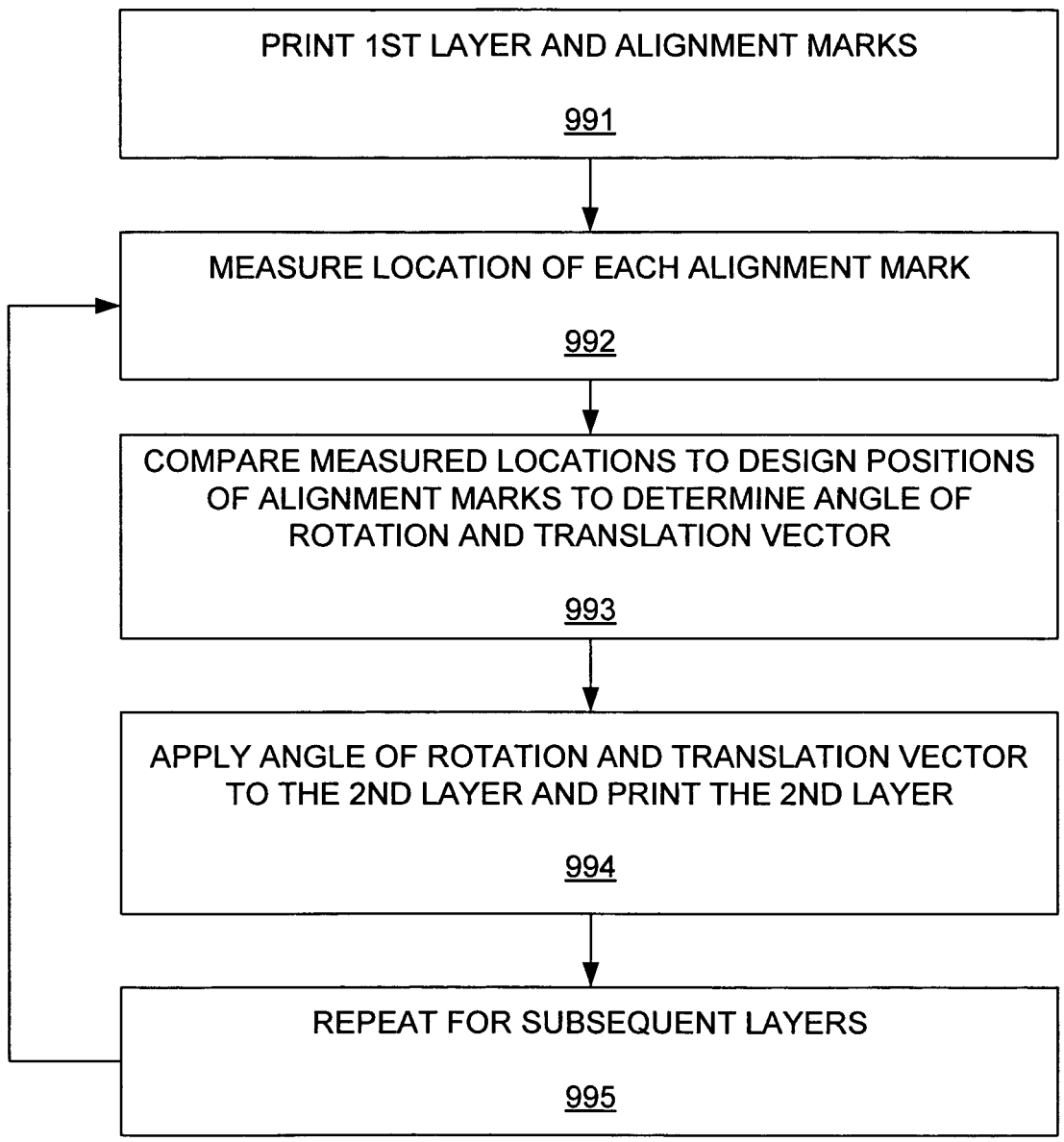

Note that if the print head only has a single ejector, the rotational orientation of the print head relative to the substrate is not as critical, since the single ejector can perform a vector printing operation. Therefore, while the layer alignment process described above could be used for a single-ejector print head, a somewhat simpler layer alignment process could also be used. FIG. 9b depicts a layer alignment operation for a single ejector print head in accordance with an embodiment of the invention. In FIG. 9b, a substrate 520 is placed on a stage 510 and is positioned using standard positioning features such as a flat 522 on substrate 520 and alignment features 511 on stage 510. Alignment marks 521(a)-521(d) have previously been printed in unused locations on substrate 520, either prior to or during printing of the initial design layer. Alignment marks 521(a)-521(d) can be part of the initial design layer, or they can be included in a special alignment design layer. Note that while four alignment marks are depicted, any number of alignment marks (greater than one) could be printed on substrate 520. Note further that while alignment marks 521(a)-521(d) are depicted as cross-shaped elements for explanatory purposes, they can comprise any shape capable of accurately indicating position. Camera 570 (the print assembly that houses camera 570 and its associated print head are not shown for clarity) measures the actual locations of alignment marks 521(a)-521(d) and determines their offsets from the design alignment mark positions. For example, the offsets in the X axis and Y axis directions for reference mark 521(a) are offsets Rx(a) and Ry(a), respectively. The measured offsets for all of reference marks 521(a)-521(d) can then be used to calculate an angle of rotation and translation vector to be applied to the next design layer to be printed on substrate 520. This process is summarized in steps 991-995 of the flow chart shown in FIG. 9d.

Printing with Sparse Ejectors

Figure 10A:
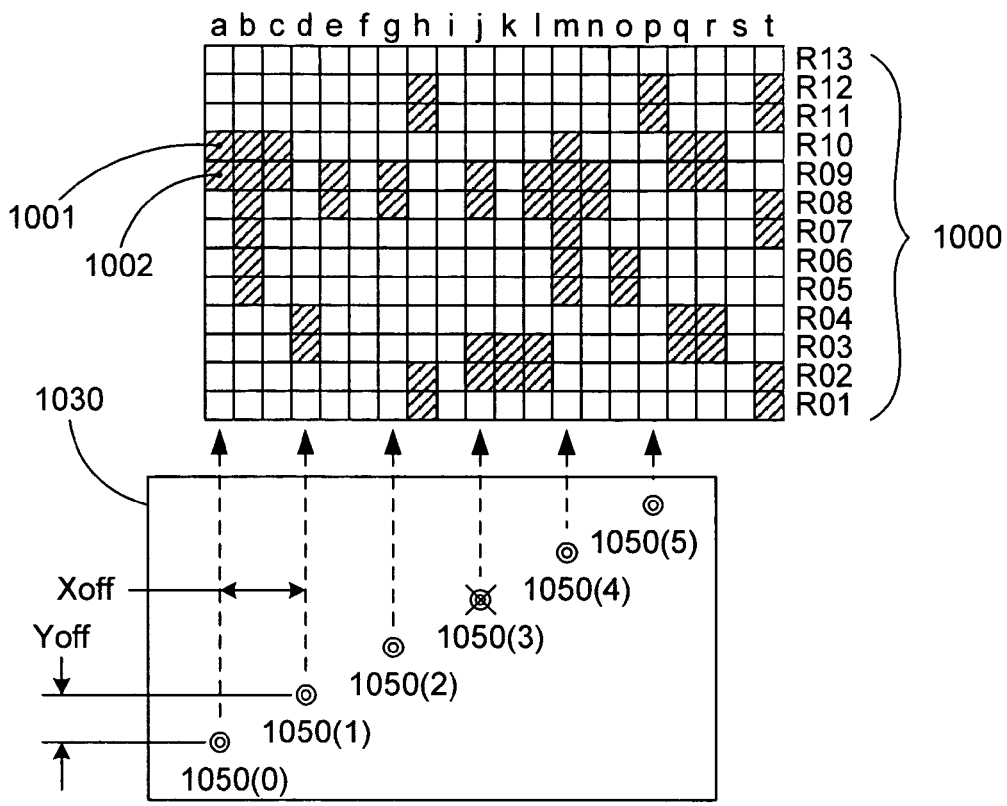
FIGS. 10a and 10b are diagrams of a procedure for printing with sparse ejectors according to another embodiment of the invention.
Figure 10B:
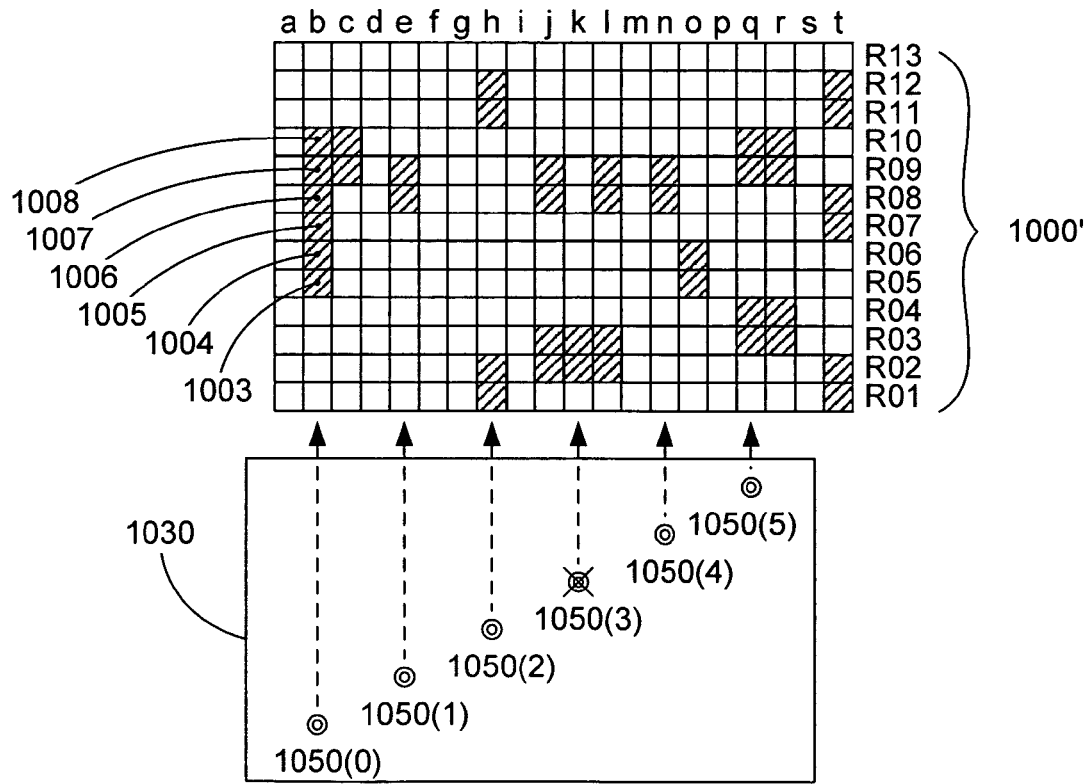

Printing with a print head in which only a portion of the ejectors is active (i.e., a "sparse ejectors" condition) requires that the control logic account for the missing (disabled) ejectors during the printing operations. FIGS. 10a and 10b depict a method for printing with a sparse set of ejectors in accordance with an embodiment of the invention. FIG. 10a shows a rasterized image 1000 of a design layer to be printed by a print head 1030. Note that while print head 1030 includes six ejectors 1050(0)-1050(5) in a diagonal line for explanatory purposes, print head 1030 can include any number of ejectors in any arrangement. Rasterized image 1000 includes raster columns a-t and rows R01-R13. The horizontal spacing Xoff and the vertical spacing Yoff between each of ejectors 1050(0)-1050(5) are selected to be an integer multiples of the raster column and row spacings of rasterized image 1000. For example, spacing Xoff is four times the raster column spacing, while spacing Yoff is two times the raster row spacing. The data to be printed in raster columns a-t are indicated by shaded regions—e.g., raster data blocks 1001 and 1002 in raster column a. Note that while the print direction is defined to be in the vertical direction for explanatory purposes, the same principles would apply to a horizontal print direction.

The sparse set of ejectors for print head 1030 is defined as all the ejectors except ejector 1050(3), which is marked with an "X" to indicate that it does not meet the specified ejector performance requirements. The first raster column containing valid data is then selected (column a in this example), and that column is set to correspond to the first ejector (ejector 1050(0) in this example). The positions of the remaining "good" ejectors 1050(1), 1050(2), 1050(4), and 1050(5) then determine the additional raster columns to be printed; i.e., columns d, g, m, and p, respectively. The print data is extracted from columns a, d, g, m, and p, and associated with ejectors 1050(0), 1050(1), 1050(2), 1050(4), and 1050(5), respectively, for the next printing pass. Note that since ejectors 1050(0)-1050(5) are offset from one another in the vertical direction, a corresponding vertical offset must be applied to the extracted raster data to ensure that the printed features are properly positioned. For example, since ejector 1050(1) is two raster rows above ejector 1050(0) in the vertical direction (offset Yoff is two), the print data associated with ejector 1050(1) must be shifted ahead by two to ensure that the printed features are properly aligned.

Figure 10C:
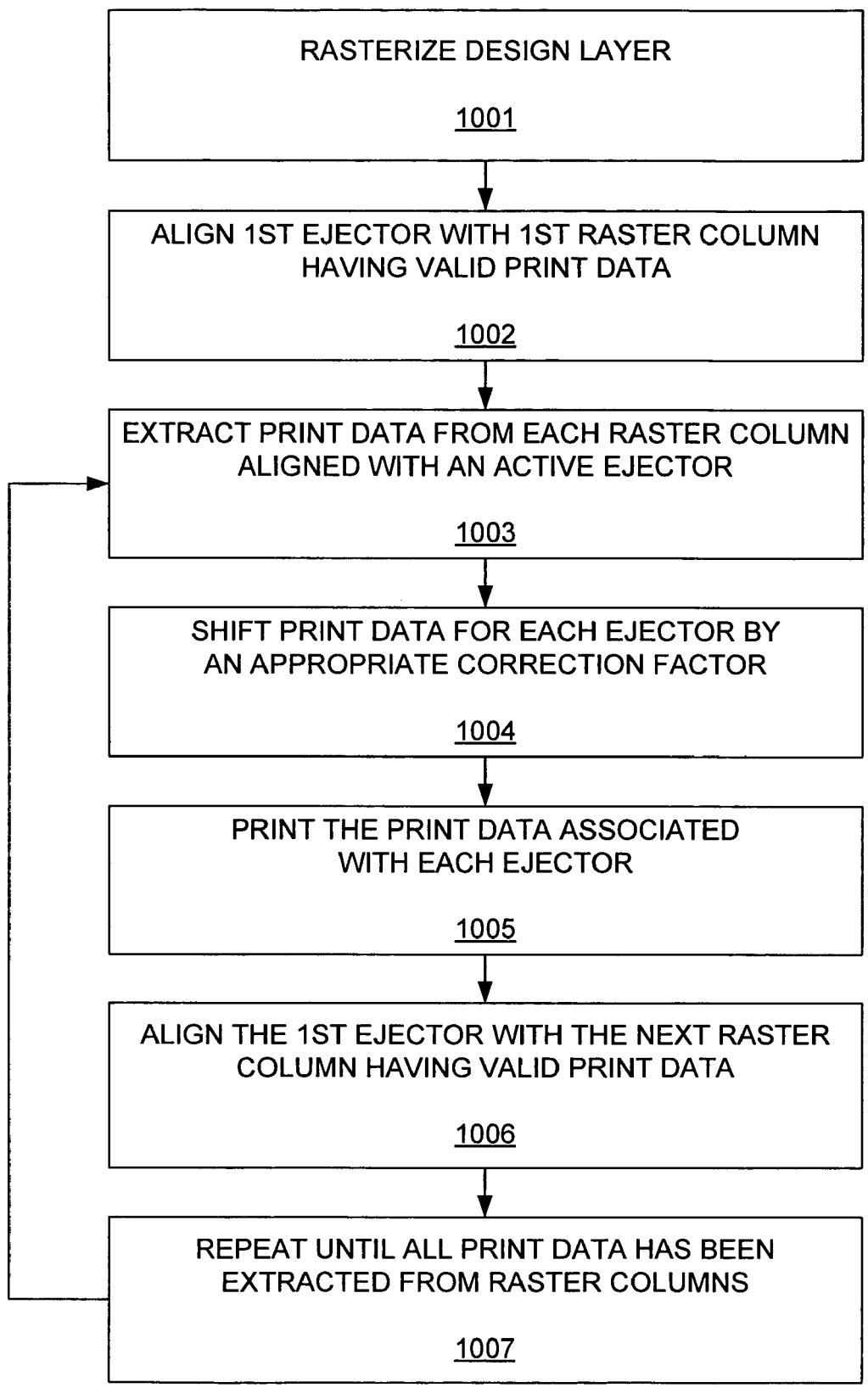
FIG. 10c is a flow diagram of the procedure for printing with sparse ejectors shown in FIGS. 10a and 10b, according to another embodiment of the invention.

FIG. 10b shows the results of the first printing pass performed in FIG. 10a. Raster columns a, d, g, m, and p have been emptied of data by the extraction operations performed with respect to FIG. 10a, so that the first column in updated rasterized image 1000' having valid data is now column b (which includes raster data blocks 1003-1008). Therefore, column b is set to correspond to ejector 1050(0), which in turn defines the correlation between ejectors 1050(1), 1050(2), 1050(4), and 1050(5) and raster columns e, h, n, and q, respectively. The print data is extracted from these new columns, the data is adjusted by the appropriate vertical offset to compensate for the vertical offset between ejectors, and a second printing pass is performed. Printing using the sparse ejectors of print head 1030 continues in this manner until no valid data remains in the rasterized image. This process is summarized in steps 1001-1007 of the flow chart shown in FIG. 10c.

Although the present invention has been described in connection with several embodiments, it is understood that this invention is not limited to the embodiments disclosed, but is capable of various modifications that would be apparent to one of ordinary skill in the art. Therefore, the invention is limited only by the following claims.

The invention claimed is:

1. A method for forming a printed pattern from a pattern layout using a printing system, the method comprising:

extracting a first design layer from the pattern layout;

performing a first print operation to print the first design layer on a substrate, wherein performing the first print operation includes making a plurality of printing passes across the substrate in a first print direction;

extracting a second design layer from the pattern layout;

performing a first alignment operation to achieve a desired orientation and positioning between the print head and the first design layer; and performing a second print operation after the first alignment operation to print the second design layer on the substrate, wherein performing the second print operation includes making a plurality of printing passes across the substrate in a second print direction that is non-parallel to the first print direction, wherein the print head includes at least one ejector, wherein performing the first print operation comprises printing a plurality of alignment marks on the substrate at a plurality of expected locations, wherein the IC printing system further comprises a camera rigidly connected to the print head, the camera having an imaging sensor comprising an alignment target, and wherein performing the first alignment operation comprises:

adjusting a rotational orientation between the substrate and the print head until a plurality of positional offsets between each of the plurality of alignment marks and a corresponding one of the plurality of expected locations are equal within a specified tolerance;

measuring an actual location for each of the plurality of alignment marks;

averaging the actual locations for each of the plurality of alignment marks to determine an alignment reference point location;

calculating an actual origin location for the first design layer by applying a predetermined offset to the alignment reference point location;

calculating a translation vector from an offset between the actual origin location and a predetermined corresponding design origin location for the first design layer; and utilizing the translation vector to align the second one of the plurality of design layers with the substrate.

2. The method of claim 1, wherein the second design layer comprises a first plurality of layout elements from the pattern layout, wherein substantially all of the first plurality of layout elements run parallel to a first reference axis, and wherein performing the second print operation comprises making the plurality of printing passes across the substrate in the second print direction such that the second print direction is aligned with the first reference axis.

3. The method of claim 1, wherein performing the first print operation comprises printing a first set of alignment marks on the substrate, wherein each of the set of alignment marks has an expected location, and wherein performing the first alignment operation comprises:

measuring an actual location for each of the plurality of alignment marks;

comparing the actual location of each of the plurality of alignment marks against the expected location for each of the plurality of alignment marks to determine an angle of rotation and translation vector; and utilizing the angle of rotation and translation vector to achieve the desired orientation and positioning between the print head and the first design layer, wherein the desired orientation and positioning causes the second design layer to be aligned with the first design layer.

4. The method of claim 1, wherein the printed pattern comprises one of an integrated circuit and a semiconductor process mask.

* * * * *

UNITED STATES PATENT AND TRADEMARK OFFICE
CERTIFICATE OF CORRECTION

PATENT NO. : 7,549,719 B2
APPLICATION NO. : 11/019038
DATED : June 23, 2009
INVENTOR(S) : Ready et al.

Page 1 of 1

It is certified that error appears in the above-identified patent and that said Letters Patent is hereby corrected as shown below:

In the Specification:

Column 1, line 13, please delete "70NANBOH3033" and insert --70NANB0H3033--.

Signed and Sealed this
Seventeenth Day of September, 2013

Teresa Stanek Rea
*Deputy Director of the United States Patent and Trademark Office*